(12) United States Patent
Yamauchi et al.

(10) Patent No.: US 6,603,165 B2
(45) Date of Patent: Aug. 5, 2003

(54) SEMICONDUCTOR DEVICE AND METHOD FOR FABRICATING THE SAME

(75) Inventors: Hideaki Yamauchi, Kawasaki (JP); Daisuke Matsubara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/100,075

(22) Filed: Mar. 19, 2002

(65) Prior Publication Data

US 2003/0089937 A1 May 15, 2003

(30) Foreign Application Priority Data

Nov. 13, 2001 (JP) ...................... 2001-347887

(51) Int. Cl.[7] ...................... H01L 27/108; H01L 29/76; H01L 29/94; H01L 31/119
(52) U.S. Cl. ...................... 257/296; 257/306
(58) Field of Search .................. 257/295–310; 438/241–254, 396–398

(56) References Cited

U.S. PATENT DOCUMENTS

2001/0020713 A1 * 9/2001 Yoshitomi et al. .......... 257/306

2002/0075743 A1 * 6/2002 Ooishi et al. ............ 365/225.7

FOREIGN PATENT DOCUMENTS

JP          2001-7293          1/2001

* cited by examiner

*Primary Examiner*—Cuong Quang Nguyen
(74) *Attorney, Agent, or Firm*—Armstrong, Westerman & Hattori, LLP

(57) ABSTRACT

The semiconductor device comprises a semiconductor substrate 10; a capacitor element 40 formed above the semiconductor substrate and including a lower electrode 34, a capacitor insulation film 36 formed on the lower electrode and an upper electrode 38 formed on the capacitor insulation film; a shield layer 14, 58 formed at least either of above and below the capacitor element; and a lead-out interconnection layer 22, 50 formed between the capacitor element and the shield layer and electrically connected to the lower electrode or the upper electrode, a plurality of holes 16, 60 being formed in each of the shield layer and the lead-out interconnection layer. The shield layers are formed above and below the MIM capacitor, whereby combination of noises with the MIM capacitor can be prevented.

20 Claims, 30 Drawing Sheets

SEMICONDUCTOR DEVICE AND METHOD FOR FABRICATING THE SAME

BACKGROUND OF THE INVENTION

The present invention relates to a semiconductor device and a method for fabricating the semiconductor device, more specifically to a semiconductor device having an MIM (Metal-Insulation-Metal) capacitor and a method for fabricating the semiconductor device.

Capacitor elements are important members of LSI, etc. having analog circuits.

Conventionally the capacitor elements have used polysilicon layer, impurity diffused layers, etc. as the electrodes, but recently capacitor elements called MIM capacitors are noted.

An MIM capacitor is a capacitor comprising a capacitor insulation film between a pair of electrodes of a metal. MIM capacitors can improve capacitor precision and frequency characteristics, and are much noted.

However, the above-described MIM capacitors are all vulnerable to external noises. Techniques for making the MIM capacitors invulnerable to external noises have been required.

SUMMARY OF THE INVENTION

An object of the present invention is to provide a semiconductor device which can prevent noises from combining with the MIM capacitor, and a method for fabricating the semiconductor device.

According to one aspect of the present invention, there is provided a semiconductor device comprising: a semiconductor substrate; a capacitor element formed above the semiconductor substrate and including a lower electrode, a capacitor insulation film formed on the lower electrode and an upper electrode formed on the capacitor insulation film; a shield layer formed at least either of above and below the capacitor element; and a lead-out interconnection layer formed between the capacitor element and the shield layer and electrically connected to the lower electrode or the upper electrode, a plurality of holes being formed in each of the shield layer and the lead-out interconnection layer.

According to another aspect of the present invention, there is provided a semiconductor device comprising: a semiconductor substrate; a capacitor element formed above the semiconductor substrate and including a lower electrode, a capacitor insulation film formed on the lower electrode and an upper electrode formed on the capacitor insulation film; a lower shield layer formed below the capacitor element; an upper shield layer formed above the capacitor element; a lower electrode lead-out interconnection layer formed between the capacitor element and the lower shield layer and electrically connected to the lower electrode; and an upper electrode lead-out interconnection layer formed between the capacitor element and the upper shield layer and electrically connected to the upper electrode, a plurality of holes being formed in each of the lower shield layer, the upper shield layer, the lower electrode lead-out interconnection layer and the upper electrode lead-out interconnection layer, an area of parts of the lower shield layer and the lower electrode lead-out interconnection layer, which are opposed to each other, and an area of parts of the upper shield layer and the upper electrode lead-out interconnection layer, which are opposed to each other being respectively set so that a parasitic capacity between the lower shield layer and the lower electrode lead-out interconnection layer and a parasitic capacity between the upper shield layer and the upper electrode lead-out interconnection layer being substantially equal to each other.

According to farther another aspect of the present invention, there is provided a method for fabricating a semiconductor device comprising the step of forming above a semiconductor substrate a capacitor element including a lower electrode, a capacitor insulation film formed on the lower electrode and an upper electrode formed on the capacitor insulation film, the method comprising the steps of: forming a lower shield layer with a plurality of holes formed in, and forming a lower electrode lead-out interconnection layer with a plurality of holes formed in, before the step of forming the capacitor element.

According to farther another aspect of the present invention, there is provided a method for fabricating a semiconductor device comprising the step of forming above a semiconductor substrate a capacitor element including a lower electrode, a capacitor insulation film formed on the lower electrode and an upper electrode formed on the capacitor insulation film, the method comprising the steps of: forming an upper electrode lead-out interconnection layer with a plurality of holes formed in and forming an upper shield layer with a plurality of holes formed in, after the step of forming the capacitor element.

According to farther another aspect of the present invention, there is provided a method for fabricating a semiconductor device comprising the step of forming above a semiconductor substrate a capacitor element including a lower electrode, a capacitor insulation film formed on the lower electrode and an upper electrode formed on the capacitor insulation film, the method comprising: the steps of forming a lower shield layer with plurality of holes formed in and forming a lower electrode lead-out interconnection layer with a plurality of holes formed in, before the step of forming the capacitor element, and the steps of forming an upper electrode lead-out interconnection layer with a plurality of holes formed in and forming an upper shield layer with a plurality of holes formed in, after the step of forming the capacitor element.

As described above, according to the present invention, the shield layers are formed above and below the MIM capacitor, whereby combination of noises with the MIM capacitor can be prevented.

According to the present invention, the lower shield layer, the lower electrode lead-out interconnection layer, the lower electrode lining interconnection layer, the upper electrode lead-out interconnection layer and the upper shield layer are all meshed, which can prevent combination of noises with the MIM capacitor while the required design rules being satisfied.

According to the present invention, the mesh-pattern of the lower shield layer and the mesh-pattern of the lower electrode lead-out interconnection layer are offset from each other in their relative positional relationship, whereby a parasitic capacity between the lower shield layer and the lower electrode lead-out interconnection layer can be made very small. According to the present invention, the mesh-pattern of the upper electrode lead-out interconnection layer and the mesh-pattern of the upper shield layer are offset from each other in their relative positional relationship, whereby a parasitic capacity between the upper electrode lead-out interconnection layer and the upper shield layer can be made very small. Thus, according to the present invention, a parasitic capacity is prohibited from affecting electric characteristics.

According to the present invention, the insulation film is formed in a height substantially equal to the upper surface of the MIM capacitor around the MIM capacitor, whereby the surface of the inter-layer insulation film is prevented from rising above the MIM capacitor, and the surface of the inter-layer insulation film can be generally at a uniform height. Accordingly, the surface of the inter-layer insulation film can be planarized by CMP, and the upper electrode lead-out interconnection layers can be buried in the inter-layer insulation films, etc. by damascene method. Accordingly, in the present invention, Cu, etc. can be used as materials of the upper electrode lead-out interconnection layers, etc.

According to the present invention, the upper electrode lead-out interconnection layer can be buried in the inter-layer insulation film having the surface planarized, whereby the upper electrode lead-out interconnection layer is prevented from breaking, etc., and high reliability can be obtained.

According to the present invention, the inter-layer insulation film, etc. can be formed on the MIM capacitor, whereby the MIM capacitor can be formed without being limited to a vicinity of the uppermost layer.

According to the present invention, the MIM capacitor can be formed without being limited to a vicinity of the uppermost layer, which allows the upper shield layer, etc. to be formed above the MIM capacitor and the upper electrode lead-out interconnection layer.

According to the present invention, the insulation film formed around the MIM capacitor and having a height substantially equal to the upper surface of the MIM capacitor functions also as a hard mask for preventing the base from being etched in patterning the layer film to form the MIM capacitor. Thus, according to the present invention, the inter-layer insulation film having the surface at a substantially uniform height can be formed without adding any step.

According to the present invention, the upper electrode of the MIM capacitor is formed thick, whereby even when the contact holes are deep down to the interconnection layer, the contact holes are prevented from passing through the upper electrode of the MIM capacitor down to the capacitor insulation film.

According to the present invention, the etching stopper film formed on the MIM capacitor can prevent the contact holes passing through the upper electrode of the MIM capacitor down to the capacitor insulation film.

According to the present invention, a plurality of the basic blocks are suitably arranged to form the patterns of the MIM capacitor, the lead-out interconnection layers, the shield layers, etc., whereby the patterns of the MIM capacitor, the lead-out interconnection layers, the shield layers, etc can be easily form by CAD or other means.

According to the present invention, based on the arrangements of the basic blocks, capacitances $C_1$, $C_2$, $C_3$, and numbers $n_1$, $n_2$, $n_3$ of the arranged respective basic blocks, a capacitance $C$ of the MIM capacitor can be easily computed, which facilitates the design.

According to the present invention, the shield layers are formed larger than size of the MIM capacitor, whereby combination of noises with the MIM capacitor can be better prevented.

According to the present invention, even in a case that a gap $d_L$ between the lower shield layer and the lower electrode lead-out interconnection layer is different from a gap $d_U$ between the upper electrode lead-out interconnection layer and the upper shield layer, a width $w_{SL}$ of the lower shield layer is made different from a width $w_{SU}$ of the upper shield layer, whereby a parasitic capacity $C_L$ between the lower shield layer and the lower electrode lead-out interconnection layer can be set to be substantially equal to a parasitic capacity $C_U$ between the upper electrode lead-out interconnection layer and the upper shield layer. According to the present invention, a parasitic capacity $C_L$ between the lower shield layer and the lower electrode lead-out interconnection layer and a parasitic capacity $C_U$ between the upper electrode lead-out interconnection layer and the upper shield layer can be made substantially equal to each other, whereby noises can be more effectively shielded.

According to the present invention, not only a width $w_{SL}$ of the mesh-pattern of the lower shield layer but also a width $w_{OL}$ of the mesh-pattern of the lower electrode lead-out interconnection layer is set to be small, and not only a width $w_{SU}$ of the mesh-pattern of the upper shield layer but also a width $w_{OU}$ of the mesh-pattern of the upper electrode lead-out interconnection layer is set to be large, but a parasitic capacity $C_L$ between the lower shield layer and the lower shield layer and a parasitic capacity $C_U$ between the upper electrode lead-out interconnection layer and the upper shield layer can be set to be substantially equal to each other.

According to the present invention, the layer film remaining on the side wall of the insulation film is to be connected to a fixed potential through the vias, the conducting layers, the lower shield layer, the upper shield layer, etc., whereby variation of a dielectric capacity of the MIM capacitor can be prevented.

According to the present invention, the interconnection layers, the semiconductor elements, etc. can be disposed above and below the MIM capacitor, whereby space savings can be attained, and a chip area can be small. According to the present invention, the semiconductor device including an MIM capacitor can be inexpensively provided.

DETAILED DESCRIPTION OF THE INVENTION

The semiconductor device according to a first embodiment of the present invention and the method for fabricating the semiconductor device will be explained with reference to FIGS. 1 to 19.

(Semiconductor Device)

Figure 1:
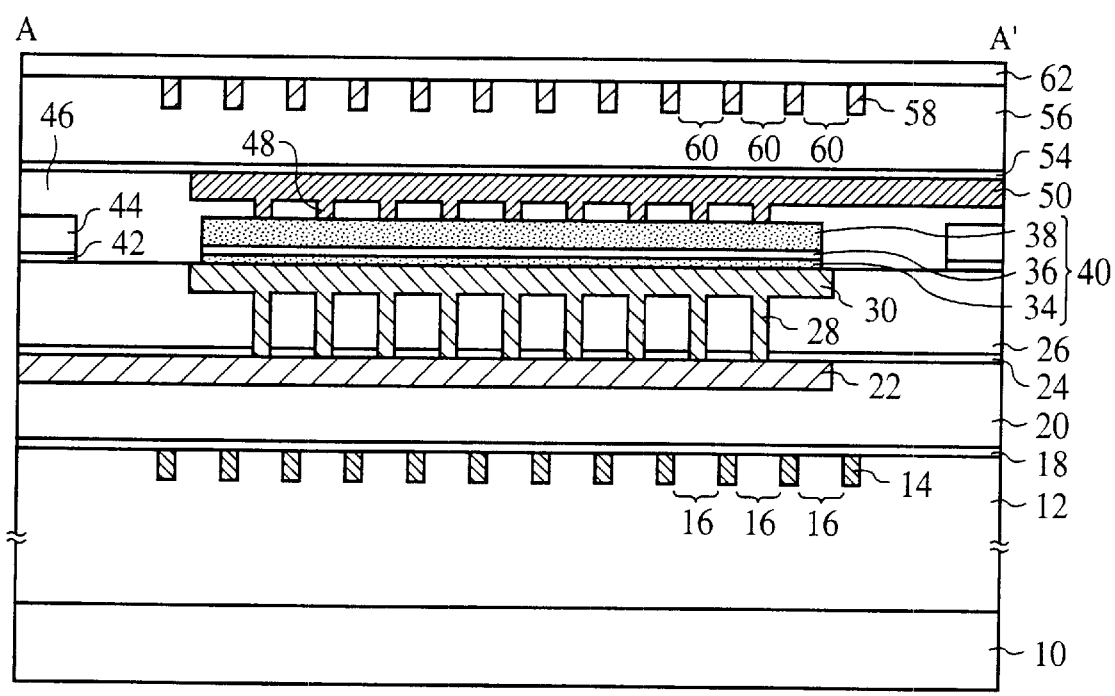
FIG. 1 is a sectional view of the semiconductor device according to a first embodiment of the present invention.
Figure 2A:
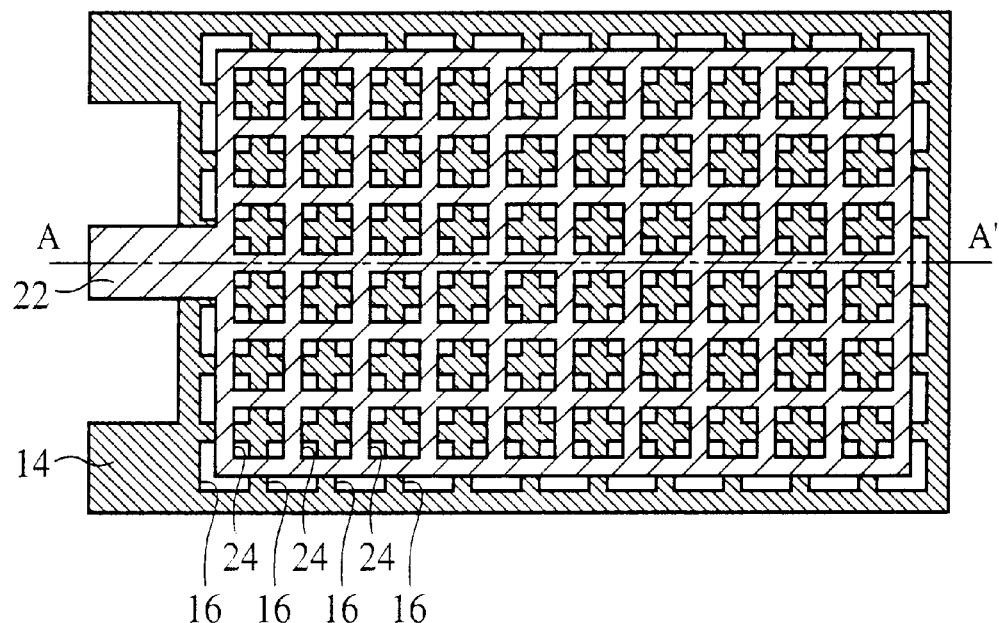
FIGS. 2A and 2B are plan views (Part 1) of the semiconductor device according to the first embodiment of the present invention.
Figure 2B:
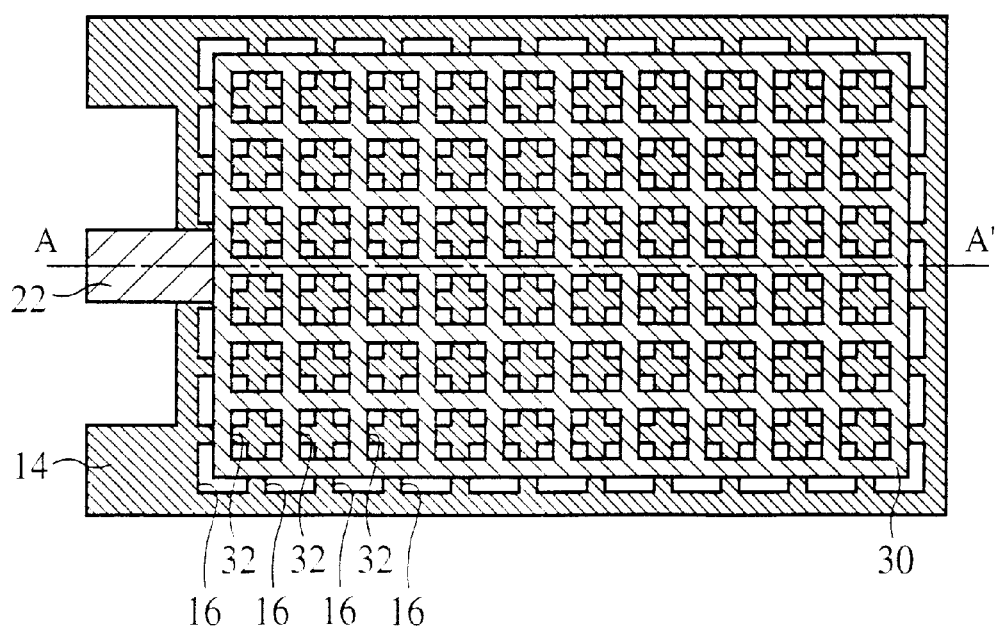
Figure 3:
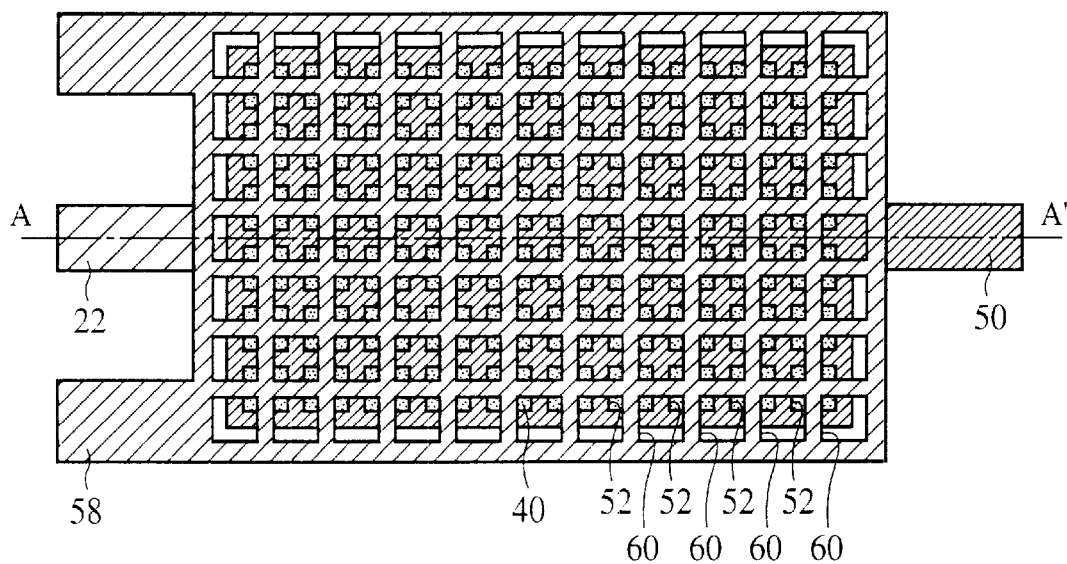
FIG. 3 is a plan view (Part 2) of the semiconductor device according to the first embodiment of the present invention.

First, the semiconductor device according to the present embodiment will be explained with reference to FIGS. 1 to 3. FIG. 1 is a sectional view of the semiconductor device according to the present embodiment. FIGS. 2A to 3 are plan views of the semiconductor device according to the present embodiment. FIG. 1 is the sectional view along the line A–A' in FIGS. 2A to 3.

As shown in FIG. 1, an inter-layer insulation film 12 of, e.g., $SiO_2$ is formed on a semiconductor substrate 10 of, e.g., silicon.

A lower shield layer 14 of Cu is buried in the inter-layer insulation film 12. The lower shield layer 14 is for preventing noises from combining with a capacitor element, i.e., an MIM capacitor 40.

As shown in FIG. 2A, a plurality of holes 16 are formed in the lower shield layer 14. The lower shield layer 14 has a mesh-pattern. The mesh-pattern of the shield layer 14 has, e.g., a 1 $\mu$m-pitch.

A cap layer 18 of SiN is formed on the inter-layer insulation film 12 with the lower shield layer 14 buried in.

An inter-layer insulation film 20 of, e.g., $SiO_2$ is formed on the cap layer 18.

A lower electrode interconnecting layer 22 of Cu is buried in the inter-layer insulation film 20.

As shown in FIG. 2A, a plurality of holes 24 are formed in the lower electrode lead-out interconnection layer 22. The lower electrode lead-out interconnection layer 22 has a mesh-pattern. A pitch of the mesh-pattern of the lower electrode lead-out interconnection layer 22 is equal to that of the mesh-pattern of the lower shield layer 14.

As shown in FIG. 2A, the mesh-pattern of the lower electrode lead-out interconnection layer 22 has a pitch offset from that of the mesh-pattern of the lower shield layer 14 by a half pitch (½ pitch).

A cap layer 24 of SiN is formed on the inter-layer insulation film 20 with the lower electrode lead-out interconnection layer 22 buried in.

An inter-layer insulation film 26 of, e.g., $SiO_2$ is formed on the cap layer 24.

Vias 28 are buried in the inter-layer insulation film 26 and the cap layer 24 down to the lower electrode lead-out interconnection layer 22.

A lower electrode lining interconnection layer 30 is buried in the inter-layer insulation film 26. As shown in FIG. 2B, a plurality of holes 32 are formed in the lower electrode lining interconnection layer 30. The lower electrode lining interconnection layer 30 has a mesh-pattern. A pitch of the mesh-pattern of the lower electrode lining interconnection layer 30 is equal to that of the patterns of the lower shield layer 14 and the lower electrode lead-out interconnection layer 22.

The vias 28 and the lower electrode lining interconnection layer 30 are integrally formed of one and the same Cu layer.

A lower electrode 34 of TiN, a capacitor insulation film 36 of SiO$_2$ and an upper electrode 38 of TiN are formed on the lower electrode lining interconnection layer 30. The lower electrode 34, the capacitor insulation film 36 and the upper electrode 38 form an MIM capacitor 40.

A cap layer 42 of SiN is formed on the inter-layer insulation film 26 around the MIM capacitor 40. An insulation film 44 of SiO$_2$ is formed on the cap layer 42. The insulation film 44 functions as a hard mask for patterning the cap layer 42. The upper surface of the insulation film 44 is at substantially the same height as the upper surfaces of the MIM capacitor 40. The insulation film 44 whose upper surface is substantially the same height as the upper surface of the MIM capacitor 40 is formed around the MIM capacitor 40 so that an insulation film 46 formed on the MIM capacitor 40 and the insulation film 44 can have the upper surface at a generally uniform height.

An inter-layer insulation film 46 is formed on the inter-layer insulation film 26 with the MIM capacitor 40, the cap layer 42 and the insulation film 44 formed on.

Vias 48 are buried in the inter-layer insulation film 46 down to the upper electrode 38 of the MIM capacitor 40.

An upper electrode lead-out interconnection layer 50 is buried in the inter-layer insulation film 46. As shown in FIG. 3, a plurality of holes 52 are formed in the upper electrode lead-out interconnection layer 50. The upper electrode lead-out interconnection layer 50 has a mesh-pattern. A pitch of the mesh-pattern of the upper electrode lead-out interconnection layer 50 is set at, e.g, 1 $\mu$m.

The vias 48 and the upper electrode lead-out interconnection layer 50 are integrally formed of one and the same Cu layer.

A cap layer 54 of SiN is formed on the inter-layer insulation film 46 with the upper electrode lead-out interconnection layer 50 buried in.

An inter-layer insulation film 56 of, e.g., SiO$_2$ is formed on the cap layer 54.

An upper shield layer 58 of Cu is buried in the inter-layer insulation film 56. As shown in FIG. 3, a plurality of holes 60 are formed in the upper shield layer 58. The upper shield layer 58 has a mesh-pattern. A pitch of the pattern of the upper shield layer 58 is set to be equal to that of pattern of the upper electrode lead-out interconnection layer 50. The pattern of the upper shield layer 58 and that of the upper electrode lead-out interconnection layer 50 are offset from each other by a half pitch.

A cap layer 62 of SiN is formed on the inter-layer insulation film 56 with the upper shield layer 58 buried in.

The semiconductor device according to the present embodiment has such structure.

It is preferable that widths and pitches of the mesh-patterns of the lower shield layer 14, the lower electrode lead-out interconnection layer 22, the lower electrode lining interconnection layer 30, the upper electrode lead-out interconnection layer 50 and the upper shield layer 58 are set in consideration of the following points.

First, prescribed design rules are preferably satisfied. Specifically, a minimum width, a maximum width, a minimum area, a maximum area, an area occupation ratio, etc. are preferably satisfied.

Preferably for the lower shield layer 14 and the upper shield layer 58, a width and a pitch of the patterns are set so as to make the shielding effect sufficient. Operational frequencies of the recent semiconductor devices are generally about 100 MHz. Some processors of high end have operational frequencies of about 1 GHz. The operational frequency may go up to about 10 GHz in future. When an operation frequency is 10 GHz, a harmonic component is 10 times the operational frequency, 100 GHz, which is 100 times the operational frequency, 1 THz. Used frequencies of RF applications are about 100 s MHz to 10 s GHz. Then, harmonic component of operational frequencies of semiconductor devices and used frequencies of RF applications will be about 1 THz at maximum. Here, a 1 THz-harmonic component is converted to wavelengths, a wavelength is above 100 $\mu$m. In the case that a pitch of the mesh-patterns are set at 1 $\mu$m, the pitch is about 1/100 of the above-described wavelength of the harmonic component. Thus, a pitch of the mesh-patterns of the shield layers are set at below 1 $\mu$m, whereby the shielding effect will be the same as that produced by the case that the shield layers are formed solid.

One main characteristic of the semiconductor device according to the present embodiment is that the shield layers are formed above and below the MIM capacitor.

In the conventional semiconductor devices, noises are often combined with the MIM capacitors. However, according to the present embodiment, the shield layers are formed above and below the MIM capacitor, whereby noises are prohibited from combining with the MIM capacitor.

One main characteristic of the semiconductor device according to the present embodiment is that patterns of the shield layers and the lead-out interconnection layers, etc. are meshed.

Recently, area occupation ratios of lead-out interconnection layers are required to be within prescribed design rules, e.g., 30 to 80%. Design rules especially for Cu lead-out interconnection layers, etc. are stricter than those for aluminum interconnection layers, etc.; for the Cu interconnection layers, area occupation ratios of the interconnection layers are required to be within prescribed ranges even in micronized regions of, e.g., 20 $\mu$m□. When patterns of the shield layers and the lead-out interconnection layers are solid, area occupation ratios of the lead-out interconnection layers are locally 100%. Thus, in a case that the shield layers and the lead-out interconnection layers are formed simply solid, prescribed design rules cannot be satisfied.

However, in the present embodiment, the patterns of the lower shield layer 14, the lower lead-out interconnection layer 22, the lower electrode lining layer 30, the upper electrode lead-out interconnection layer 50 and the upper shield layer 50 are meshed. Thus, according to the present embodiment, prescribed design rules can be satisfied while noises can be prohibited from combining the MIM capacitor.

Further another characteristic of the semiconductor device according to the present embodiment is that the mesh-pattern of the lower shield layer 14 and that of the lower electrode lead-out interconnection layer 22 are positionally offset from each other by a half pitch, and the mesh-pattern of the upper electrode lead-out interconnection layer 50 and that of the upper shield layer 58 are positionally offset from each other by a half pitch.

In a case that the mesh-patterns of the shield layers and those of the lead-out interconnection layers are in agreement with each other in their relative positional relationship, the shield layers and the lead-out interconnection layers are opposed each other over a large area, and some parasitic capacity is present, affecting the electric characteristics.

However, in the present embodiment, the mesh-pattern of the lower shield layer 14 and that of the lower electrode lead-out interconnection layer 22 are offset from each other by a half pitch in the relative positional relationship, whereby the lower shield layer 14 and the lower electrode lead-out interconnection layer 22 are opposed each other over a small area, whereby a parasitic capacity between the lower shield layer 14 and the lower electrode lead-out interconnection layer 22 can be made very small. Furthermore, in the present embodiment, the mesh-pattern of the upper electrode lead-out interconnection layer 50 and that of the upper shield layer 58 are offset from each other by a half pitch in the relative positional relationship, whereby the upper electrode lead-out interconnection layer 50 and the upper shield layer 58 are opposed each other over a small area, whereby a parasitic capacity between the upper electrode lead-out interconnection layer 50 and the upper shield layer 58 can be made very small. Thus, according to the present embodiment, a parasitic capacity can be made small while noises can be prohibited from combining with the MIM capacitor 40.

(Method for Fabricating the Semiconductor Device)

Figure 4A:
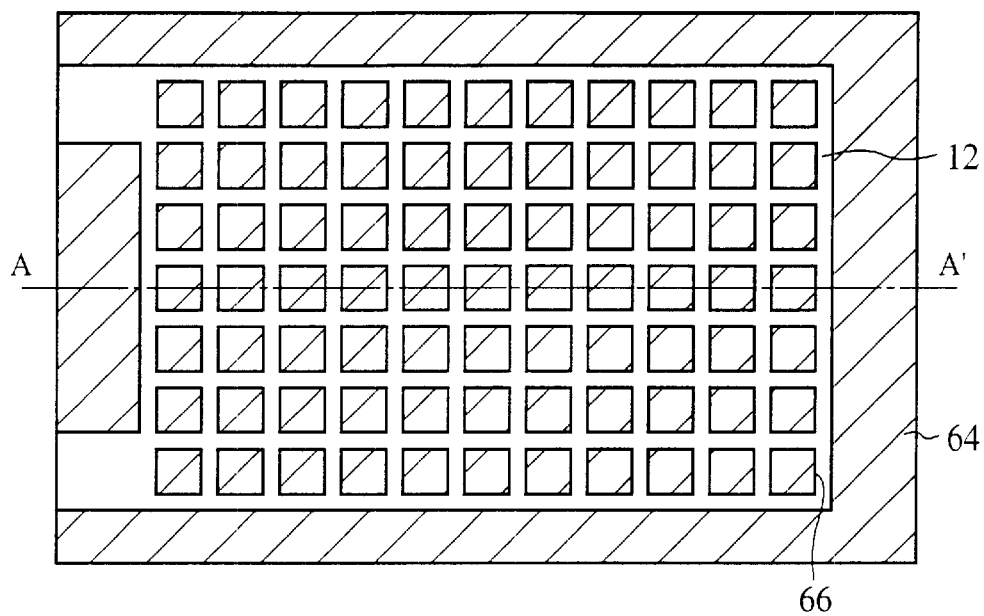
FIGS. 4A to 4C are a plan view and sectional views of the semiconductor device according to the first embodiment of the present invention, which show the method for fabricating the semiconductor device (Part 1).
Figure 4B:
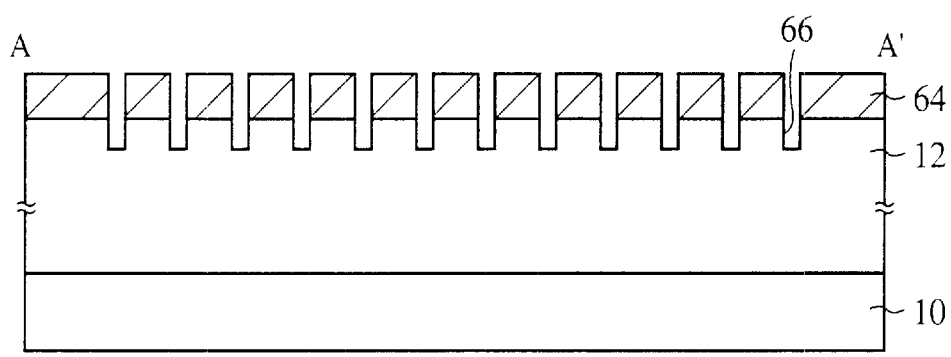
Figure 4C:
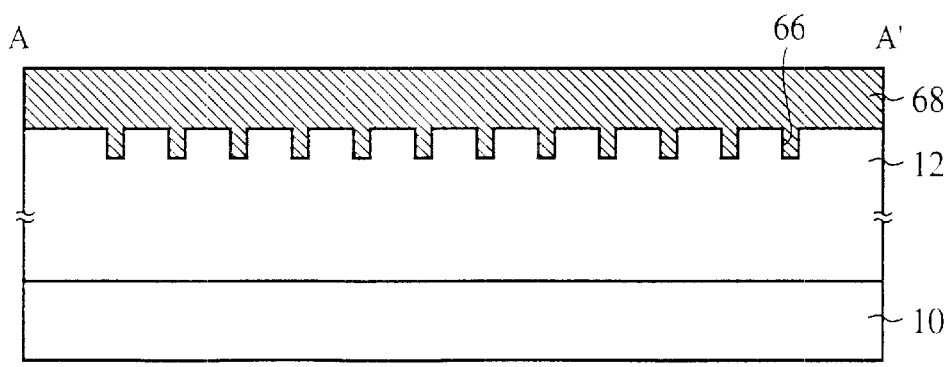
Figure 5A:
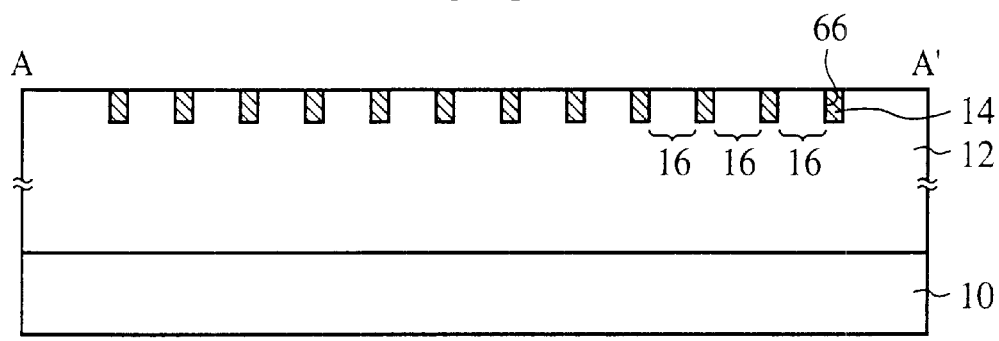
FIGS. 5A to 5C are sectional views and a plan view of the semiconductor device according to the first embodiment of the present invention, which show the method for fabricating the semiconductor device (Part 2).
Figure 5B:
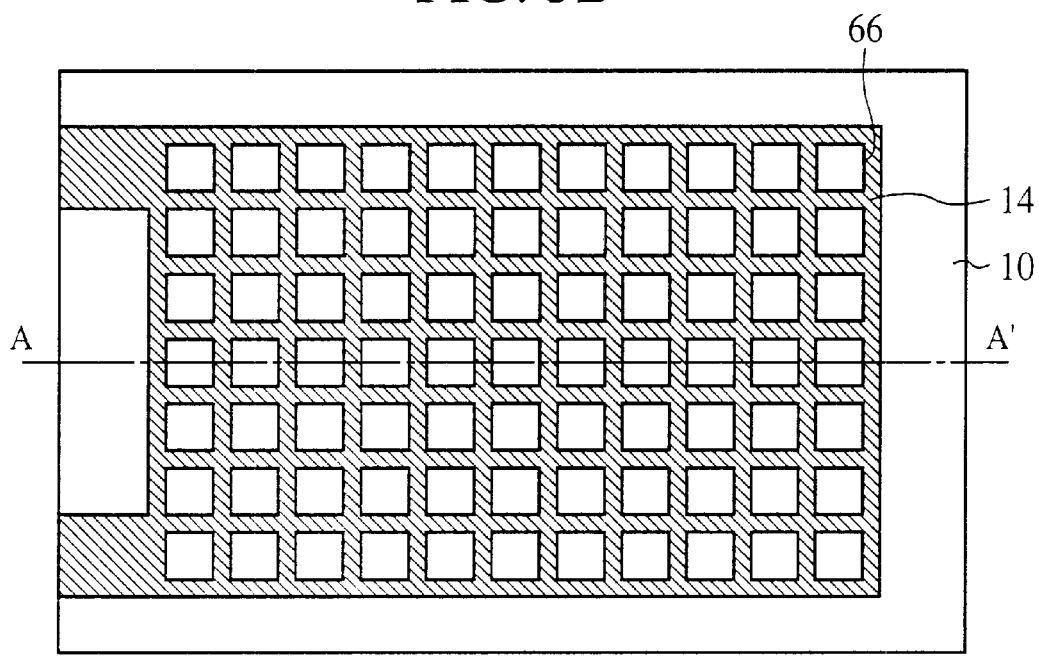
Figure 5C:
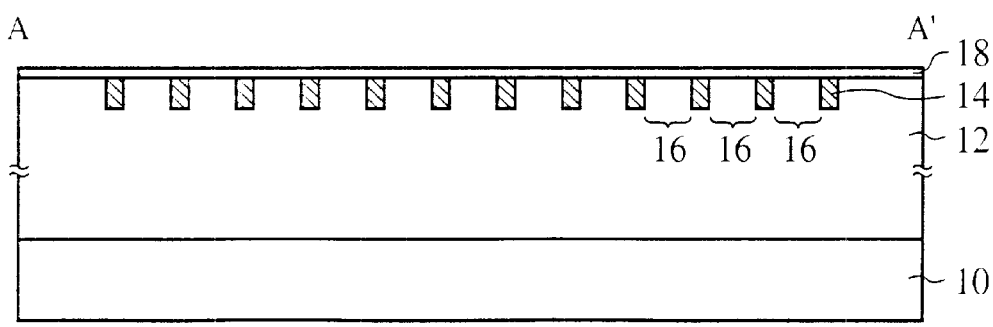
Figure 6A:
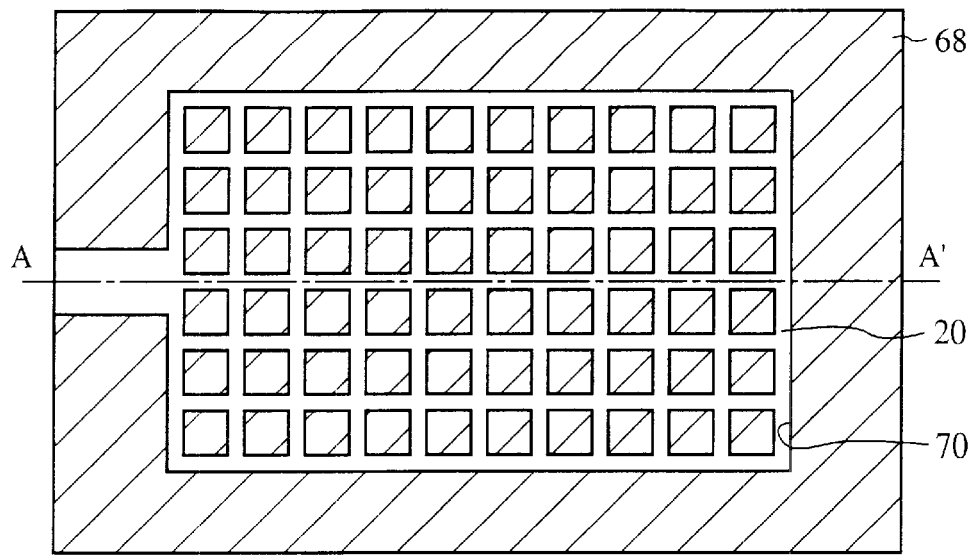
FIGS. 6A to 6C are a plan view and sectional views of the semiconductor device according to the first embodiment of the present invention, which show the method for fabricating the semiconductor device (Part 3).
Figure 6B:
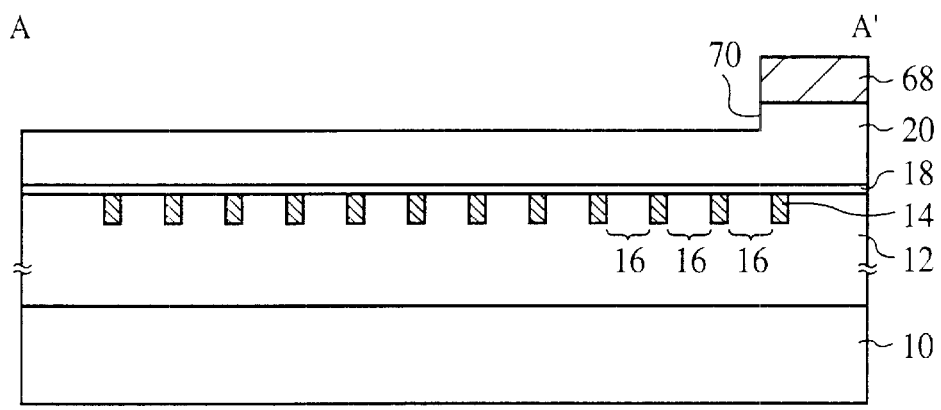
Figure 6C:
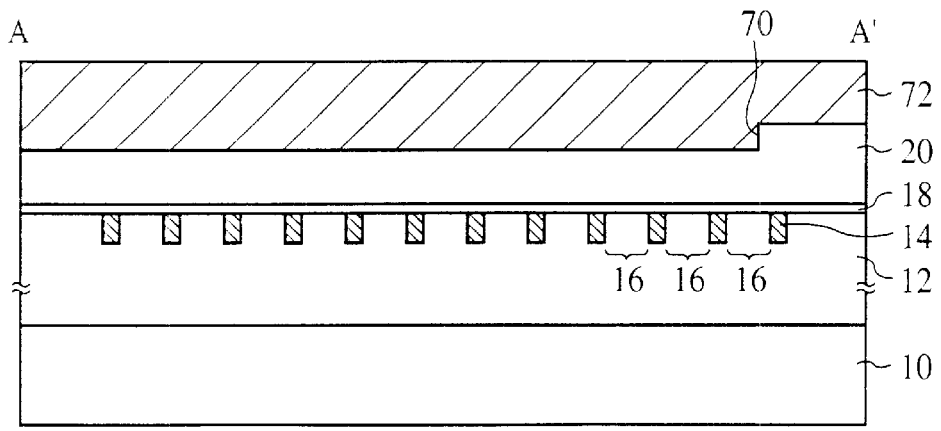
Figure 7A:
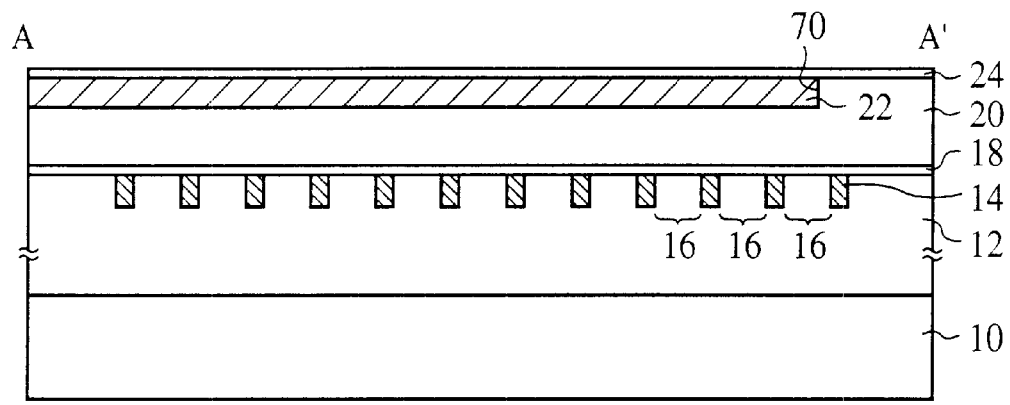
FIGS. 7A and 7B are a sectional view and a plan view of the semiconductor device according to the first embodiment of the present invention, which show the method for fabricating the semiconductor device (Part 4).
Figure 7B:
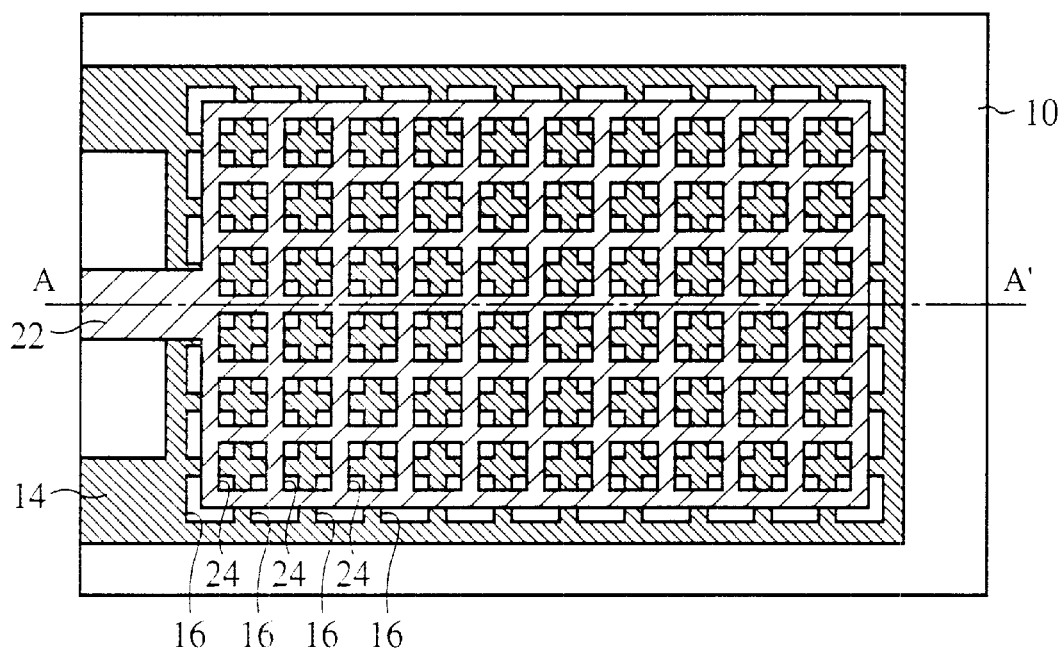
Figure 8A:
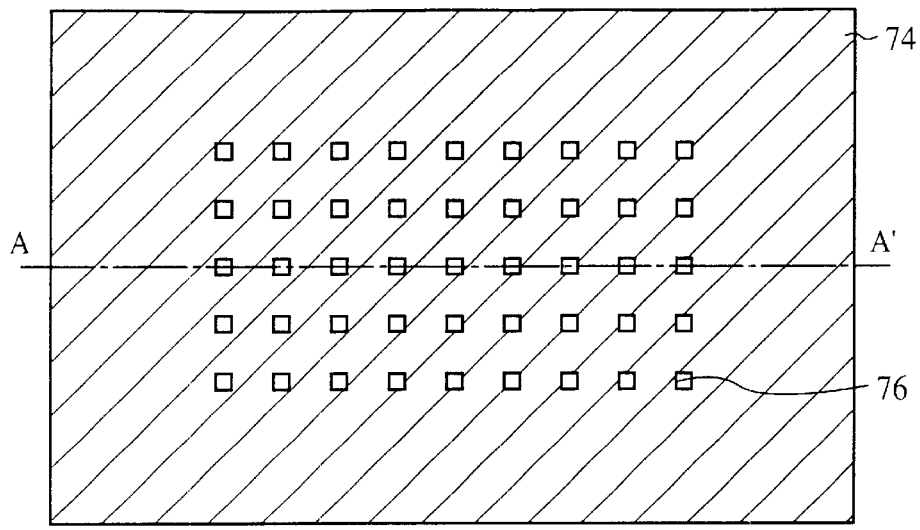
FIGS. 8A to 8C are a plan view and sectional views of the semiconductor device according to the first embodiment of the present invention, which show the method for fabricating the semiconductor device (Part 5).
Figure 8B:
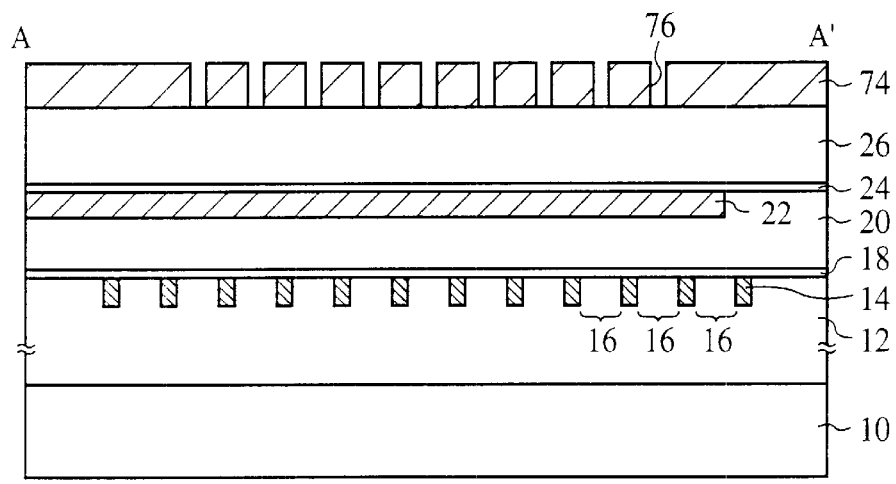
Figure 8C:
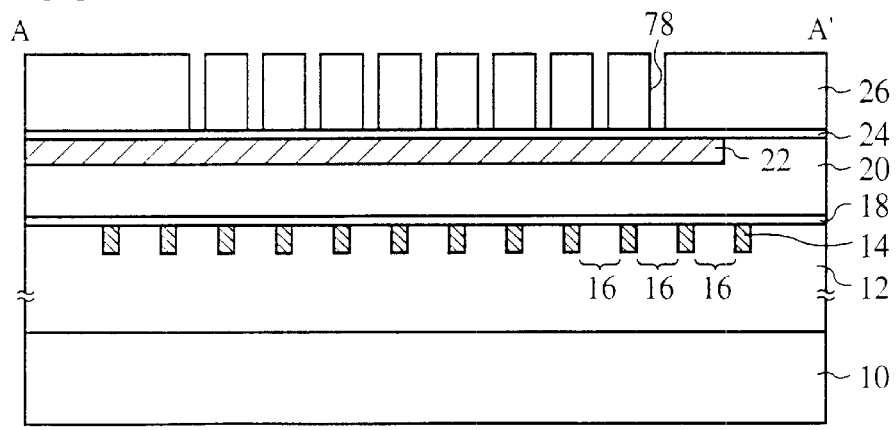
Figure 9A:
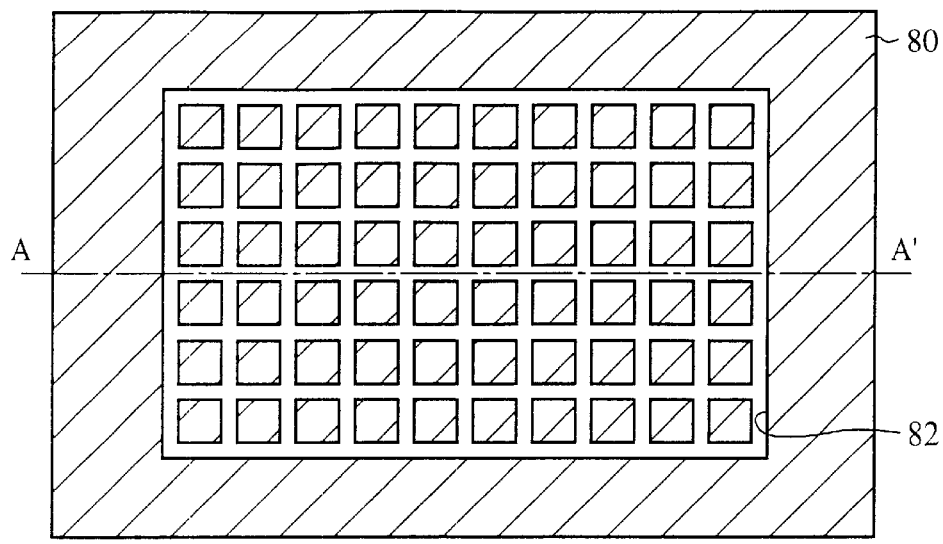
FIGS. 9A to 9C are a plan view and sectional views of the semiconductor device according to the first embodiment of the present invention, which show the method for fabricating the semiconductor device (Part 6).
Figure 9B:
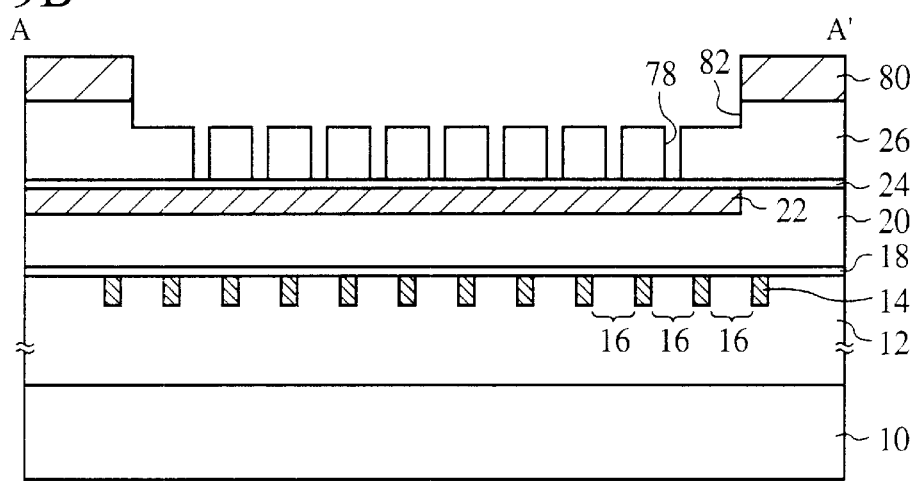
Figure 9C:
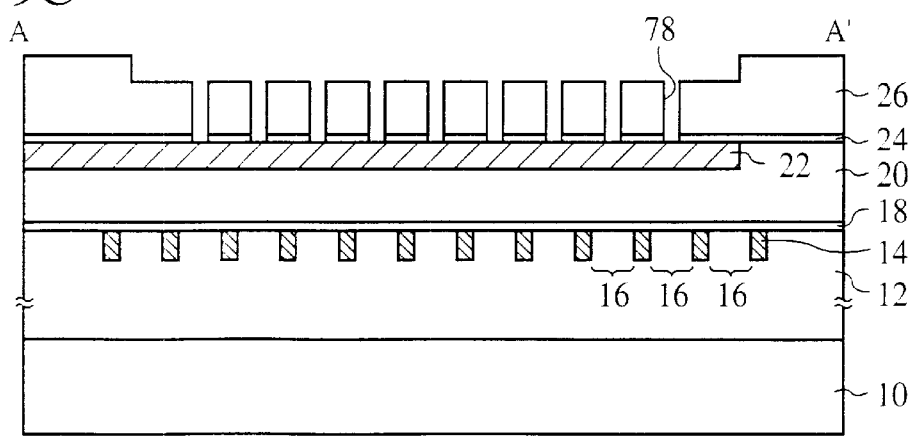
Figure 10A:
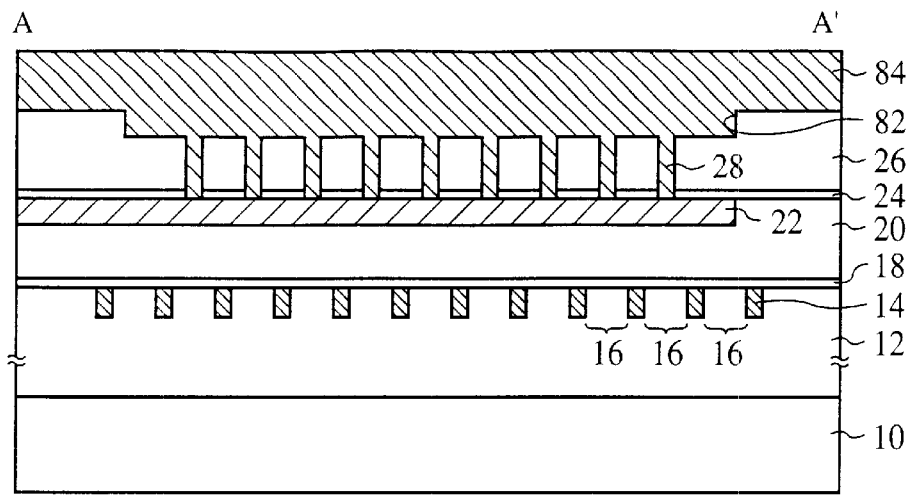
FIGS. 10A to 10C are sectional views and a plan view of the semiconductor device according to the first embodiment of the present invention, which show the method for fabricating the semiconductor device (Part 7).
Figure 10B:
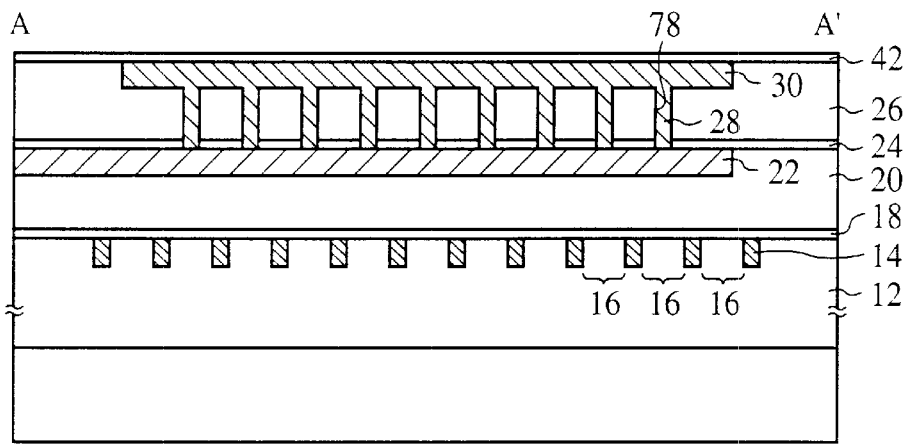
Figure 10C:
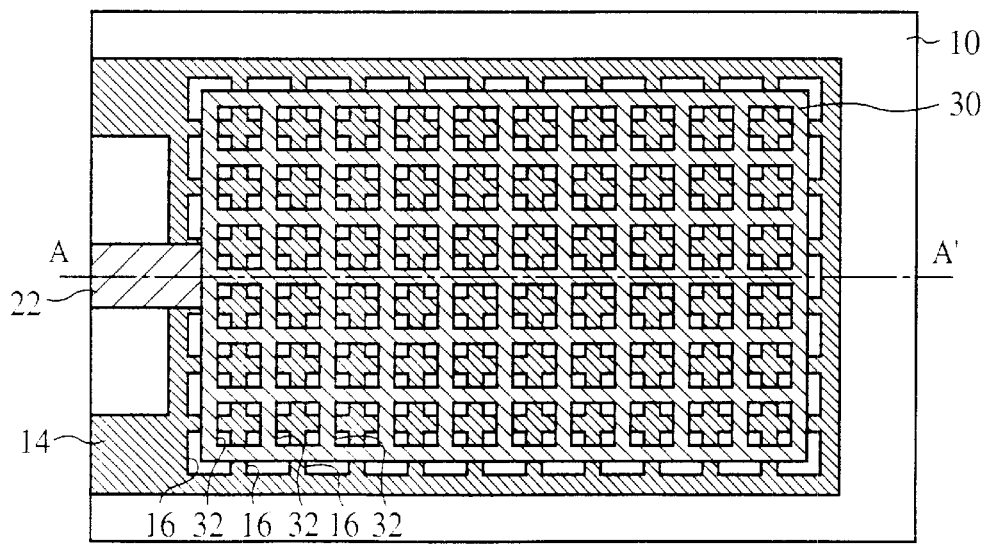
Figure 11A:
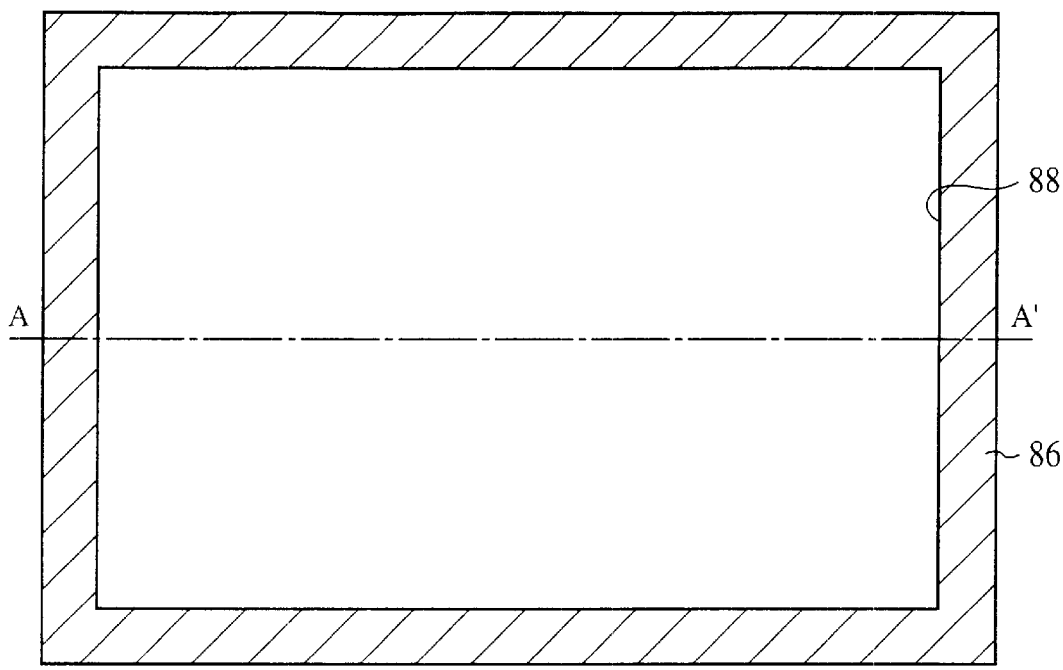
FIGS. 11A and 11B are a plan view and a sectional view of the semiconductor device according to the first embodiment of the present invention, which show the method for fabricating the semiconductor device (Part 8).
Figure 11B:
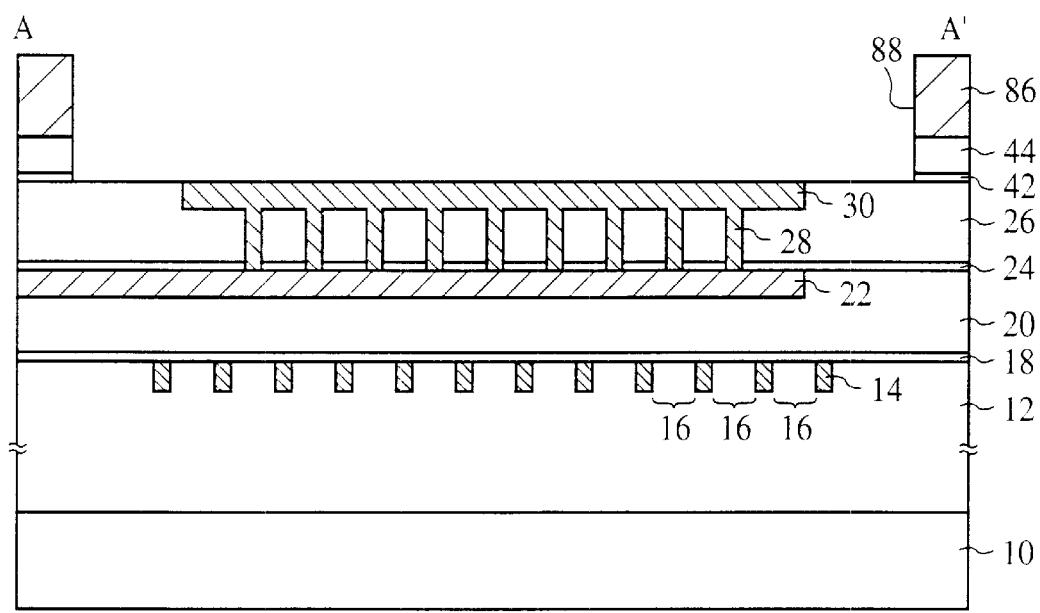
Figure 14A:
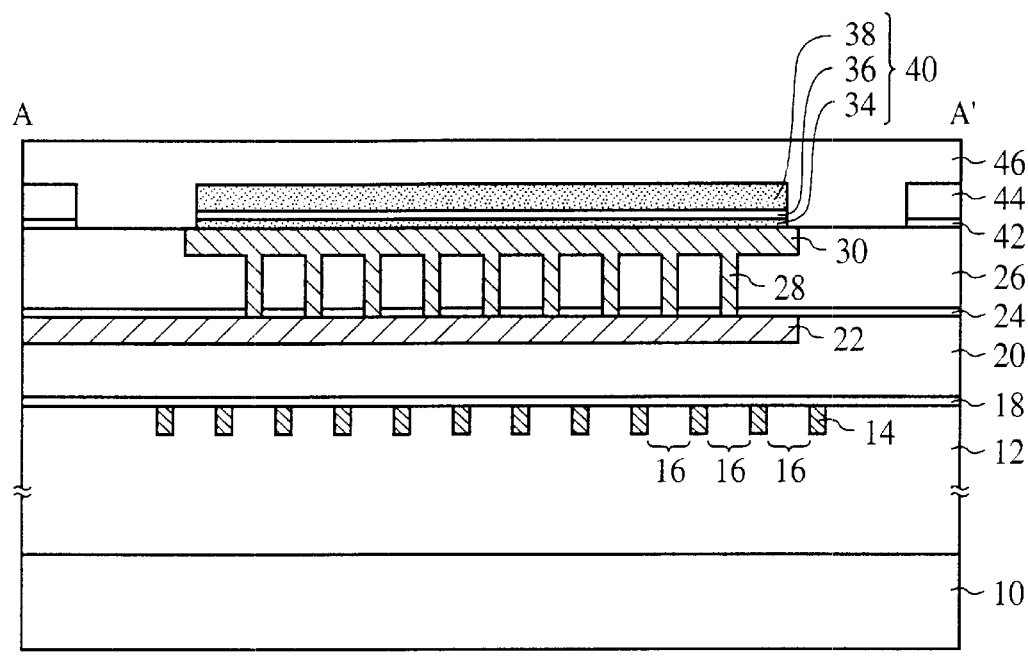
FIGS. 14A and 14B are a sectional view and a plan view of the semiconductor device according to the first embodiment of the present invention, which show the method for fabricating the semiconductor device (Part 11).
Figure 14B:
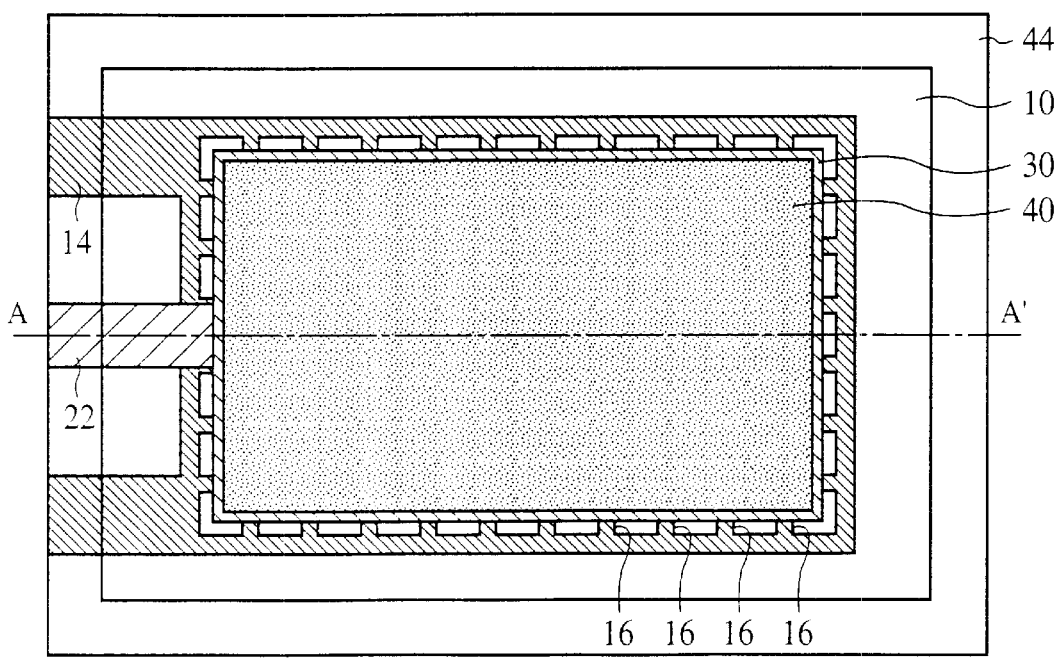
Figure 15A:
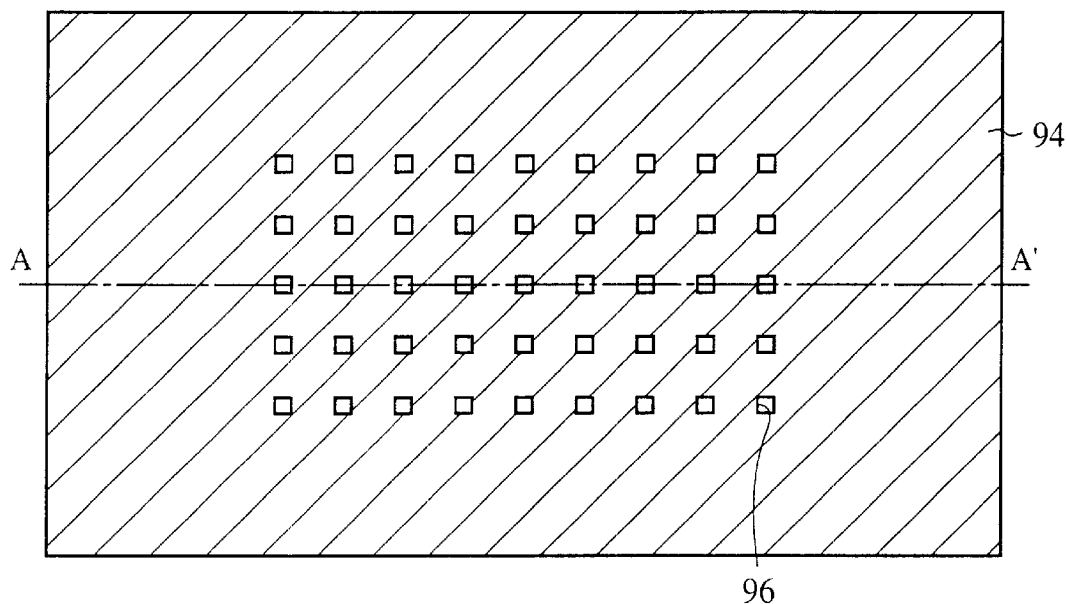
FIGS. 15A and 15B are a plan view and a sectional view of the semiconductor device according to the first embodiment of the present invention, which show the method for fabricating the semiconductor device (Part 12).
Figure 15B:
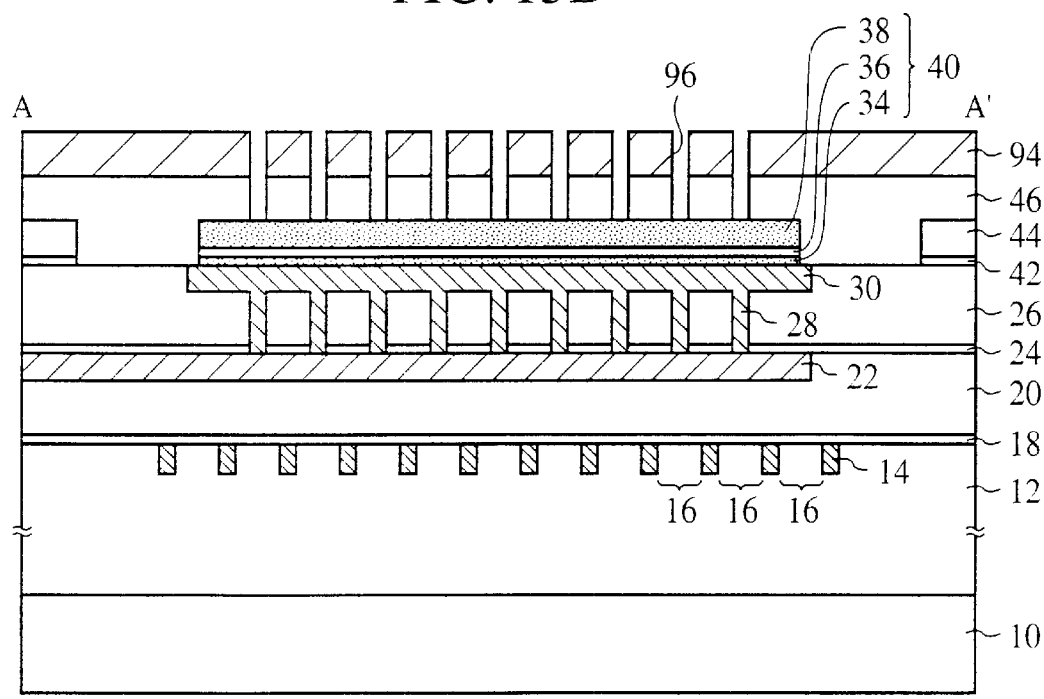
Figure 16A:
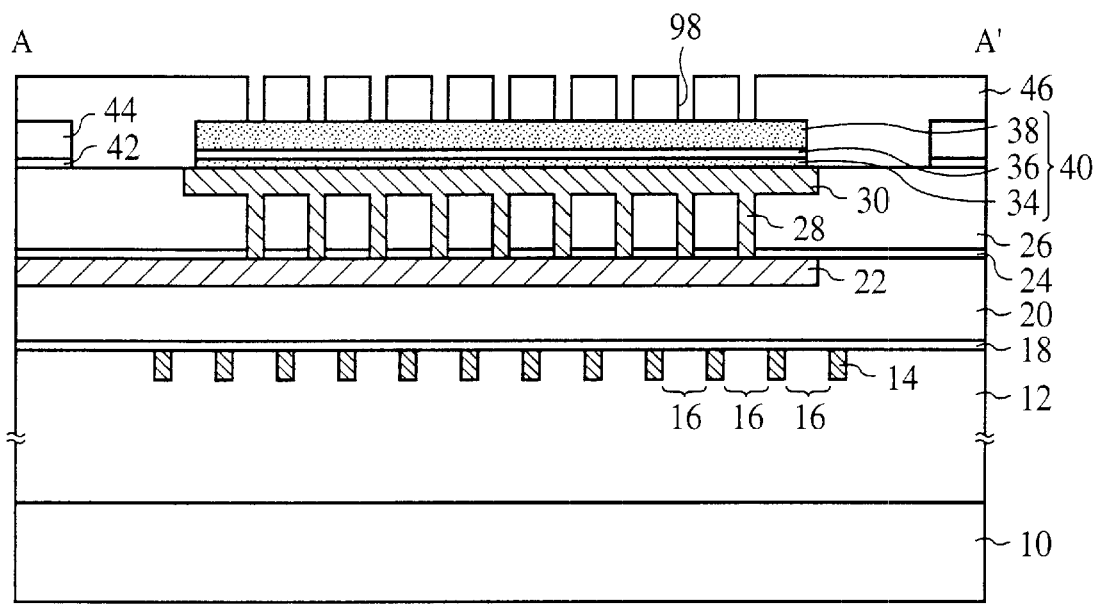
FIGS. 16A and 16B are sectional views of the semiconductor device according to the first embodiment of the present invention, which show the method for fabricating the semiconductor device (Part 13).
Figure 16B:
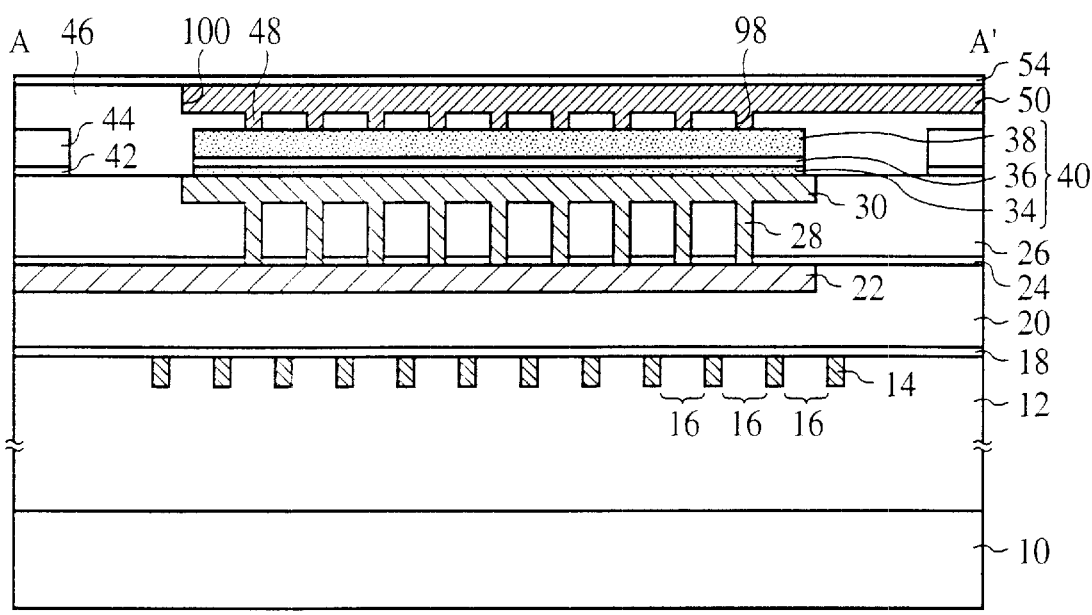
Figure 17A:
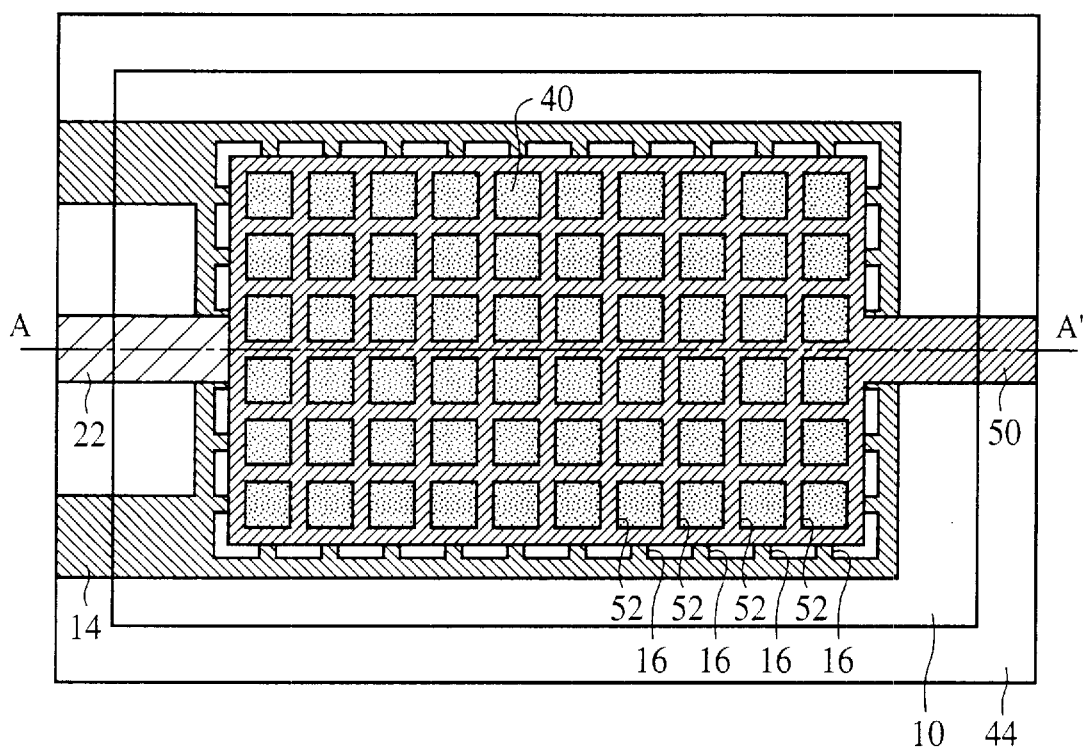
FIGS. 17A and 17B are plan views of the semiconductor device according to the first embodiment of the present invention, which show the method for fabricating the semiconductor device (Part 14).
Figure 17B:
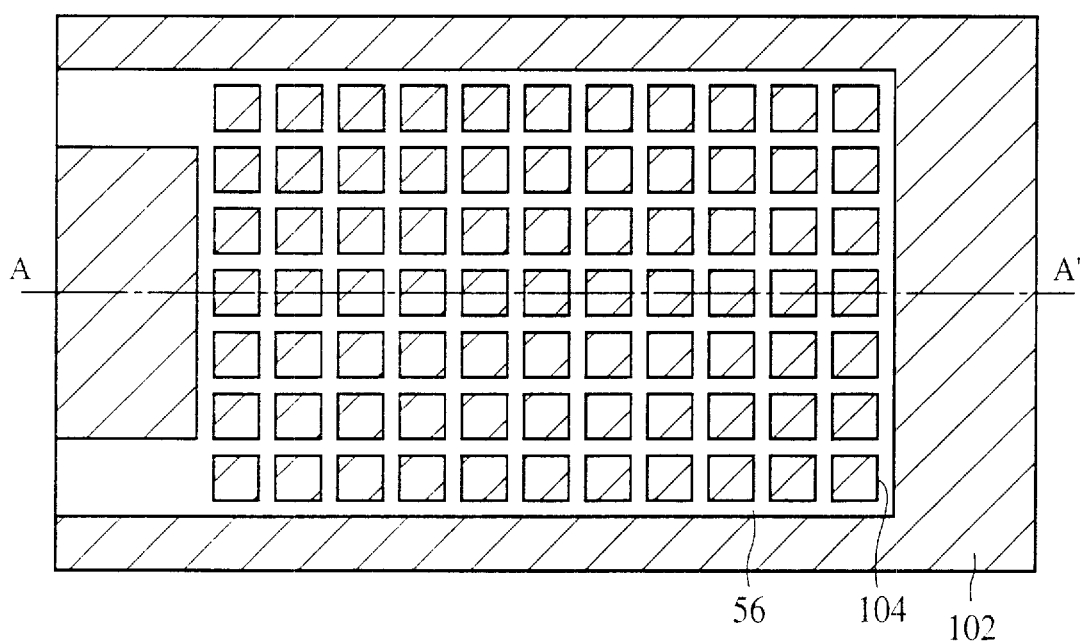
Figure 18A:
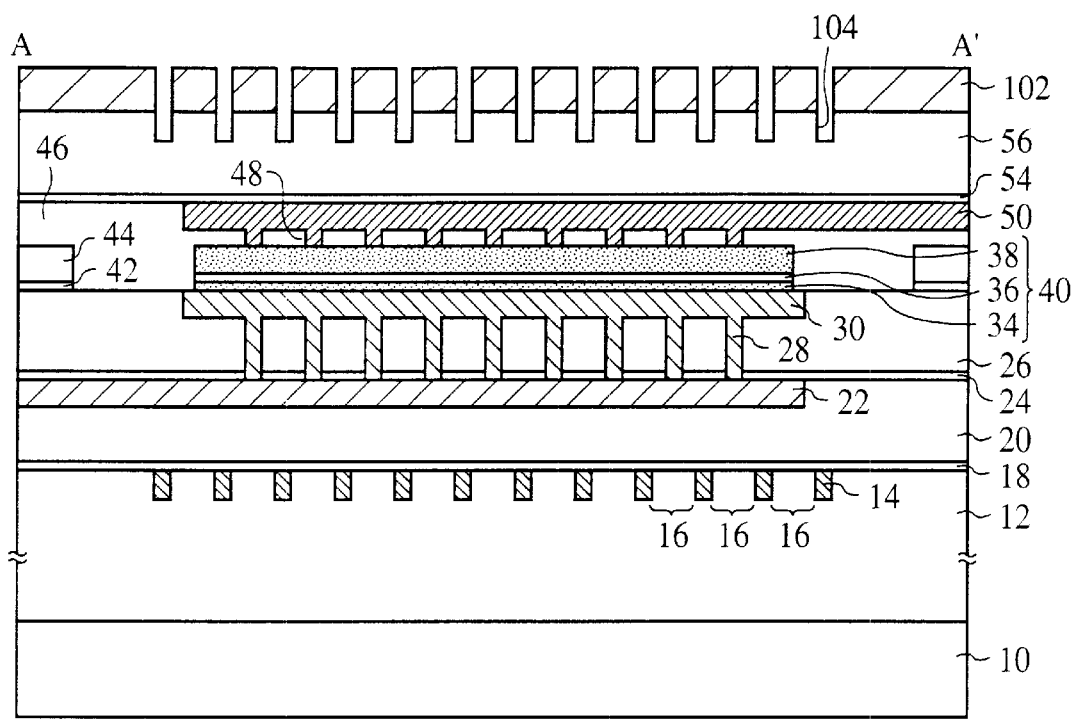
FIGS. 18A and 18B are sectional views of the semiconductor device according to the first embodiment of the present invention, which show the method for fabricating the semiconductor device (Part 15).

Then, the method for fabricating the semiconductor device will be explained with reference to FIGS. 4A to 19. FIGS. 4A to 19 are views of the semiconductor device in the steps of the method for fabricating the semiconductor device, which show the method. FIG. 4A is a plan view. FIGS. 4B and 4C are sectional views. FIG. 4B is the sectional view along the line A–A' in FIG. 4A. FIG. 5A is a sectional view. FIG. 5B is a plan view, and FIG. 5C is a sectional view. FIG. 5A is the sectional view along the line A–A' in FIG. 5B. FIG. 6A is a plan view, and FIGS. 6B and 6C are sectional views. FIG. 7A is a sectional view, and FIG. 7B is a plan view. FIG. 7A is the sectional view along the line A–A' in FIG. 7B. FIG. 8A is a plan view. FIGS. 8B and 8C are sectional views. FIG. 8B is the sectional view along the line A–A' in FIG. 8A. FIG. 9A is a plan view, and FIGS. 9B and 9C are sectional views. FIG. 9B is the sectional view along the line A–A' in FIG. 9A. FIGS. 10A and 10B are sectional views. FIG. 10C is a plan view. FIG. 10B is the sectional view along the line A–A' in FIG. 10C. FIG. 11A is a plan view, and FIG. 11B is a sectional view. FIGS. 12A to 13B are sectional views. FIG. 14A is a sectional view, and FIG. 14B is a plan view. FIG. 15A is a plan view, and FIG. 15B is a sectional view. FIG. 15B is the sectional view along the line A–A' in FIG. 15A. FIGS. 16A and 16B are sectional views. FIGS. 17A and 17B are plan views. FIGS. 18A to FIG. 19 are sectional views. FIG. 18A is the sectional view along the line A–A' in FIG. 17B.

First, the inter-layer insulation film 12 is formed of, e.g., 600 nm-thickness $SiO_2$ on a semiconductor substrate 10 of, e.g., silicon by plasma enhanced CVD (see FIGS. 4A and 4B).

Then, a resist film 64 is formed on the entire surface by spin coating.

Next, the resist film 64 is patterned by photolithography to form a mesh-pattern in the resist film 64.

Then, with the resist film 64 as a mask, the inter-layer insulation film 12 is etched to form in the inter-layer insulation film 12 in a mesh-groove 66 for the lower shield layer 14 to be buried in.

Next, as shown in FIG. 4C, the Cu layer 68 is formed of, e.g., a 600 nm-thickness Cu layer on the entire surface by plating. The Cu layer 68 is for forming the lower shield layer 14.

Then, as shown in FIG. 5A, the Cu layer is polished by CMP until the surface of the inter-layer insulation film 12 is exposed to bury the lower shield layer 14 of the Cu in the mesh-groove 66 formed in the inter-layer insulation film 12.

Thus, as shown in FIG. 5B, the meshed shield layer 14 is formed.

Next, as shown in FIG. 5C, the cap layer 18 is formed of, e.g., 50 nm-thickness SiN on the entire surface by plasma enhanced CVD.

Next, the inter-layer insulation film 20 is formed of, e.g., $SiO_2$ on the entire surface (see FIGS. 6A and 6B).

Next, a resist film 68 is formed on the entire surface by spin coating.

Then, the resist film 68 is patterned by photolithography to form a mesh-pattern in the photoresist film 68.

Then, with the resist film 68 as a mask, the inter-layer insulation film 20 is etched to form in the inter-layer insulation film 20 a mesh-groove 70 for the lower electrode lead-out interconnection layer 22 to be buried in.

Next, as shown in FIG. 6C, the Cu layer 72 is formed in a 600 nm-thickness on the entire surface by plating. The Cu layer 72 is for forming the lower electrode lead-out interconnection layer 22.

Then, the Cu layer is polished by CMP until the surface of the inter-layer insulation film 20 is exposed to bury the lower electrode lead-out interconnection layer 22 of the Cu in the mesh-groove 70 formed in the inter-layer insulation film 20 (see FIG. 7A).

Thus, as shown in FIG. 7B, the meshed shield layer 22 is formed.

Next, the cap layer 24 is formed of, e.g., 50 nm-thickness SiN on the entire surface.

Then, the inter-layer insulation film 26 is formed of, e.g., $SiO_2$ on the entire surface (see FIGS. 8A and 8B).

Next, a resist film 74 is formed on the entire surface by spin coating.

Next, the resist film 74 is patterned by photolithography to form the openings 76 in the resist film 74 down to the inter-layer insulation film 26.

Then, with the resist film 74 as a mask, the inter-layer insulation film 26 is etched to form contact holes 78 in the inter-layer insulation film 26 down to the cap layer 24 (see FIG. 8C).

Then, a resist film 80 is formed on the entire surface by spin coating (see FIGS. 9A and 9B).

Then, the resist film 80 is patterned by photolithography to form the mesh-pattern in the resist film 80.

Next, with the resist film 80 as a mask, the inter-layer insulation film 26 is etched to form in the inter-layer insulation film 26 the mesh-groove 82 for the vias 28 and the lower electrode lining interconnection layer 30 to be buried in.

Next, as shown in FIG. 9C, the cap layer 24 exposed in the contact holes 78 is etched to form the contact holes 78 down to the lower electrode lead-out interconnection layer 22.

Next, as shown in FIG. 10A, the Cu layer 84 is formed in a 600 nm-thickness on the entire surface by plating. The Cu layer 84 is for forming the lower electrode lining interconnection layer 30 and the vias 28.

Next, the Cu layer 84 is polished by CMP until the surface of the inter-layer insulation film 26 is exposed. Thus, the meshed lower electrode lining interconnection layer 30 of the Cu is buried in the groove 82 formed in the inter-layer insulation film 26, while the vias 28 of the Cu are buried in the contact holes 78 (see FIGS. 10B and 10C).

Next, the cap layer 42 is formed of 50 nm-thickness SiN on the entire surface by plasma enhanced CVD (see FIGS. 11A and 11B).

Then, the insulation film 44 is formed of 150 nm-thickness $SiO_2$ on the entire surface by plasma enhanced CVD. The insulation film 44 functions as a hard mask in etching the cap layer 42.

Next, a resist film 86 is formed on the entire surface by spin coating. Then, an opening 88 is formed in the resist film 86 by photolithography.

Then, the insulation film 44 is etched with the resist film 86 as a mask.

Next, the cap layer 42 is etched with the insulation film 44 as a mask.

Figure 12A:
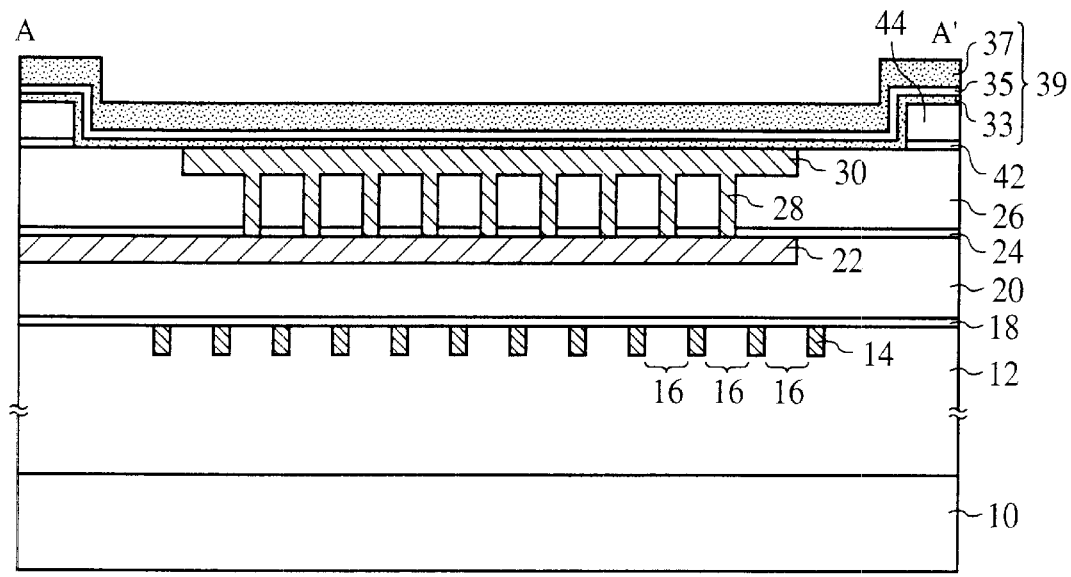
FIGS. 12A and 12B are sectional views of the semiconductor device according to the first embodiment of the present invention, which show the method for fabricating the semiconductor device (Part 9).
Figure 12B:
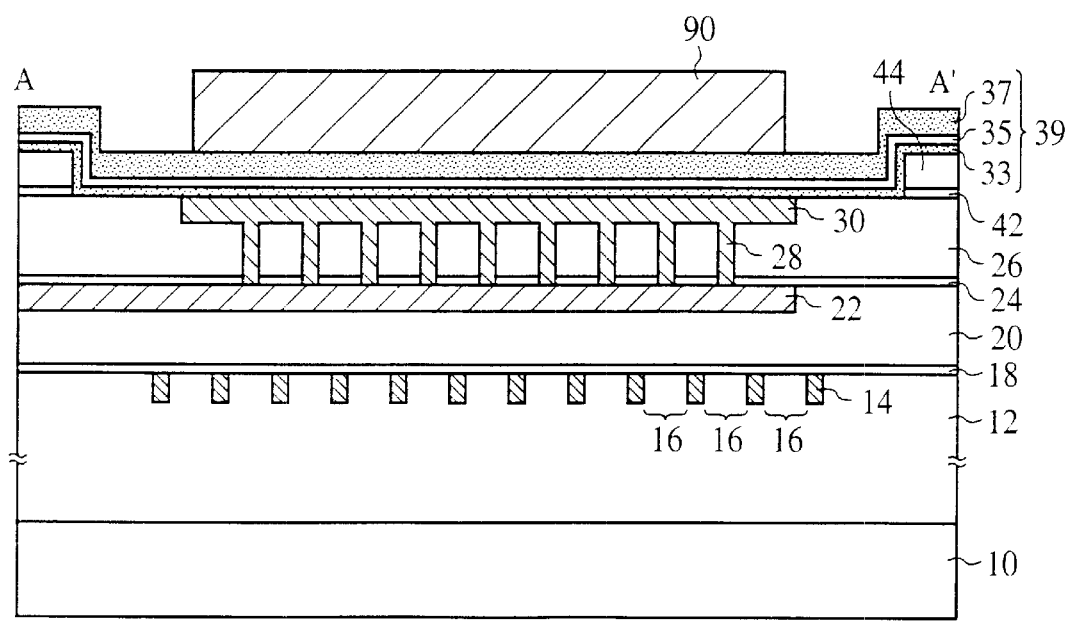

Then, as shown in FIG. 12A, a 70 nm-thickness TiN film 33 is formed on the entire surface by sputtering. The TiN film 33 is for forming the lower electrode 34.

Next, a 30 nm-thickness $SiO_2$ film 35 is formed on the entire surface by plasma enhanced CVD. The $SiO_2$ film 35 is for forming the capacitor insulation film 36.

Next, a 100 nm-thickness TiN film 37 is formed on the entire surface by sputtering. The TiN film 37 is for forming the upper electrode 38.

Thus, the layer film 39 is formed of the TiN film 33, the $SiO_2$ film 35 and the TiN film 37.

Then, a resist film 90 is formed on the entire surface by spin coating. Then, the resist film 90 is patterned by photolithography (see FIG. 12B). The resist film 90 is for patterning the layer film 39 into a configuration of the MIM capacitor 40.

Next, the layer film 39 is etched with the resist film 90 as a mask. The insulation film 44 functions as a spacer for unifying a height of the surface. Thus, the MIM 40 is formed of the layer film 39 (see FIG. 13A).

Figure 13A:
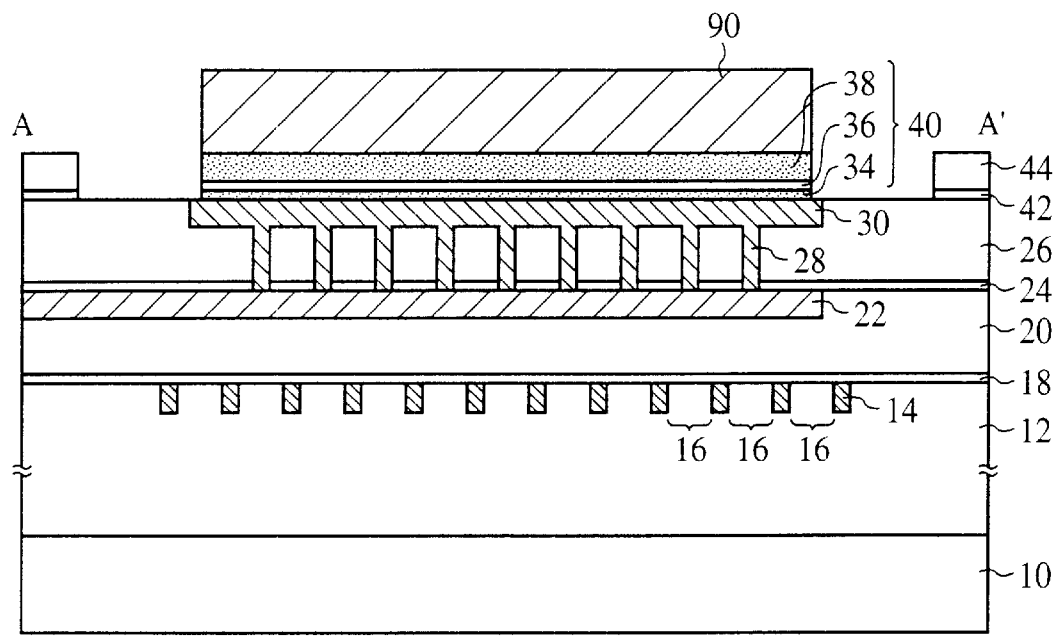
FIGS. 13A and 13B are sectional views of the semiconductor device according to the first embodiment of the present invention, which show the method for fabricating the semiconductor device (Part 10).
Figure 13B:
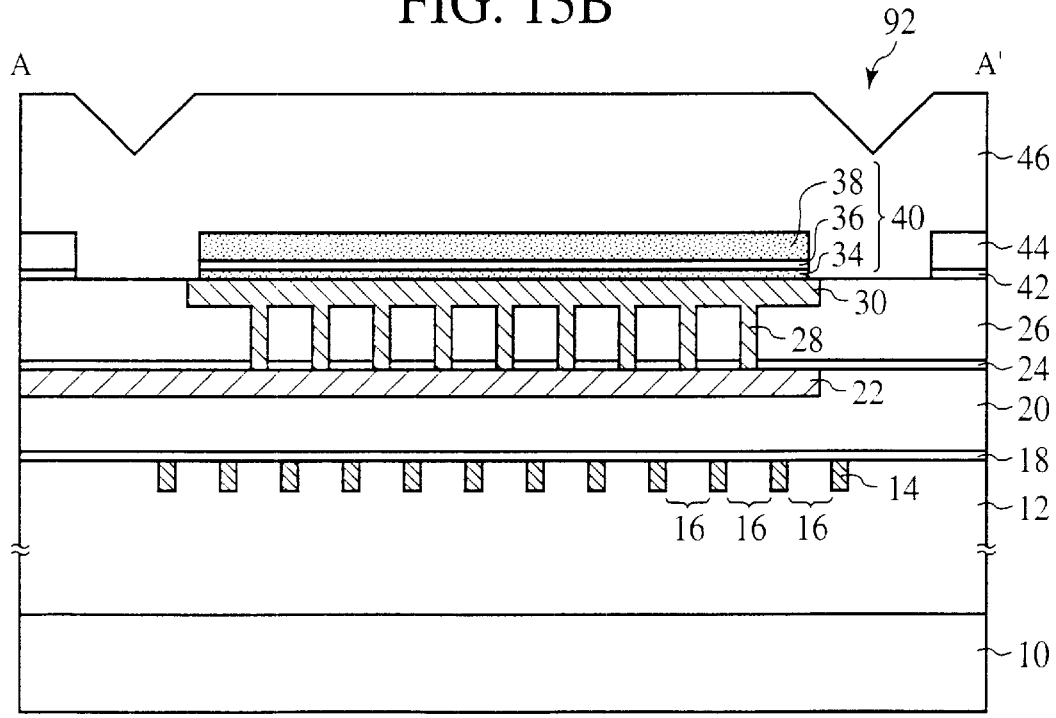

Next, as shown in FIG. 13B, the inter-layer insulation film 46 is formed of a 2000 nm-thickness $SiO_2$ film on the entire surface by, e.g., high-density plasma enhanced CVD. The upper surface of the MIM capacitor 40 and that of the insulation film 44 are at substantially the same height, which positions the surface of the inter-layer insulation film 46 at substantially the same height.

As shown in FIG. 13B, a recess 92 is formed in the surface of the part of the inter-layer insulation film 46 between the region where MIM capacitor 40 is formed and the region where the insulation film 44 is formed. However, the surface of the inter-layer insulation film 46 can be polished even by CMP in a later step, because the surface of the inter-layer insulation film 46 is generally at a uniform height.

Then, the surface of the inter-layer insulation film 46 is polished by CMP, and the inter-layer insulation film 46 has the surface made even (see FIGS. 14A and 14B).

Next, a resist film 94 is formed on the entire surface by spin coating (see FIGS. 15A and 15B).

Then, the resist film 94 is patterned by photolithography to form in the resist film 94 openings 96 for forming contact holes 98.

Next, with the resist film 94 as a mask, the inter-layer insulation film 46 is etched to form the contact holes 98 in the inter-layer insulation film 46 down to the upper electrode 38 of the MIM capacitor 40 (see FIG. 16A).

Then, the mesh-groove 100 is formed in the inter-layer insulation film 46 by photolithography (see FIG. 16B). The mesh-groove 100 is for burying the upper electrode lead-out interconnection layer 50 in the inter-layer insulation film 46.

Next, a Cu layer of, e.g., a 600 nm-thickness is formed on the entire surface by plating. The Cu layer is for burying the vias 48 in the contact holes 98 and burying the upper electrode lead-out interconnection layer 50 in the mesh-groove 100.

Next, the surface of the Cu layer is polished by CMP until the surface of the inter-layer insulation film 46 is exposed to bury the vias 48 of the Cu in the contact holes 98 and burying the upper electrode lead-out interconnection layer 50 in the mesh-groove 100. Thus, the meshed upper electrode lead-out interconnection layer 50 is formed (see FIG. 17A).

Next, the cap layer 54 is formed of 50 nm-thickness SiN on the entire surface by plasma enhanced CVD.

Then, the inter-layer insulation film 56 is formed of 600 nm-thickness $SiO_2$ on the entire surface by plasma enhanced CVD (see FIG. 17B and FIG. 18A).

Next, a resist film 102 is formed on the entire surface by spin coating.

Then, the resist film 102 is patterned by lithography to form in the resist film 102 a pattern for the mesh-groove 102.

Next, with the resist film 102 as a mask, the inter-layer insulation film 56 is etched to form in the inter-layer insulation film 56 the mesh-groove 104 for the upper shield layer 58 to be buried in.

Figure 18B:
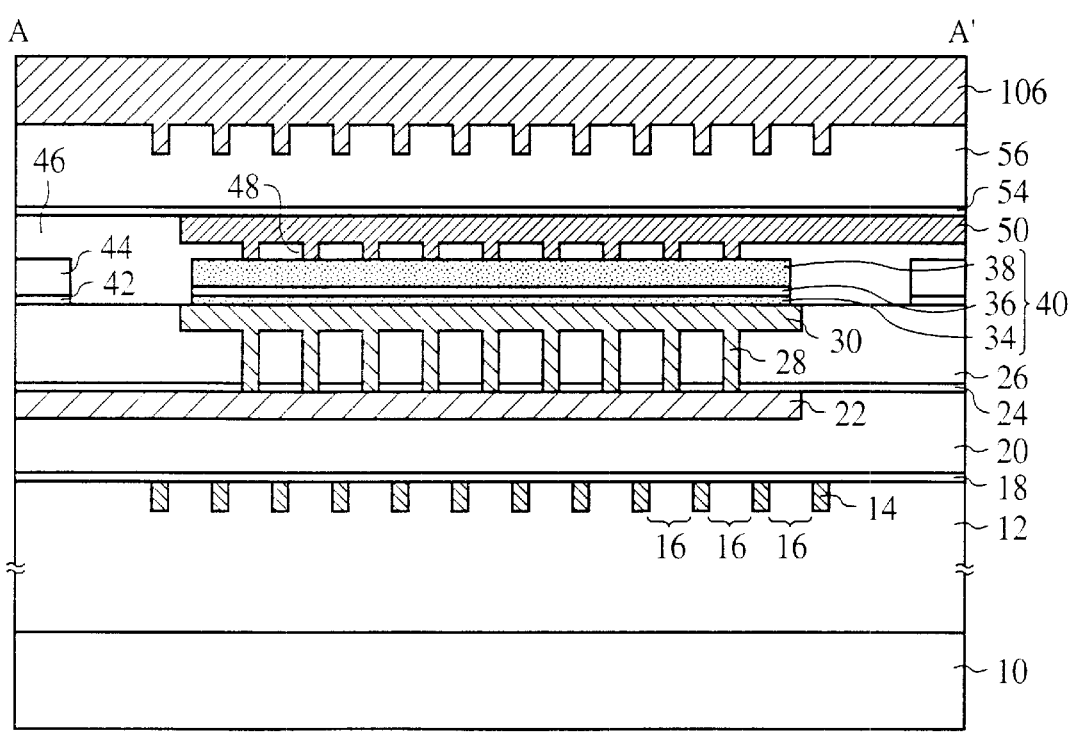
Figure 19:
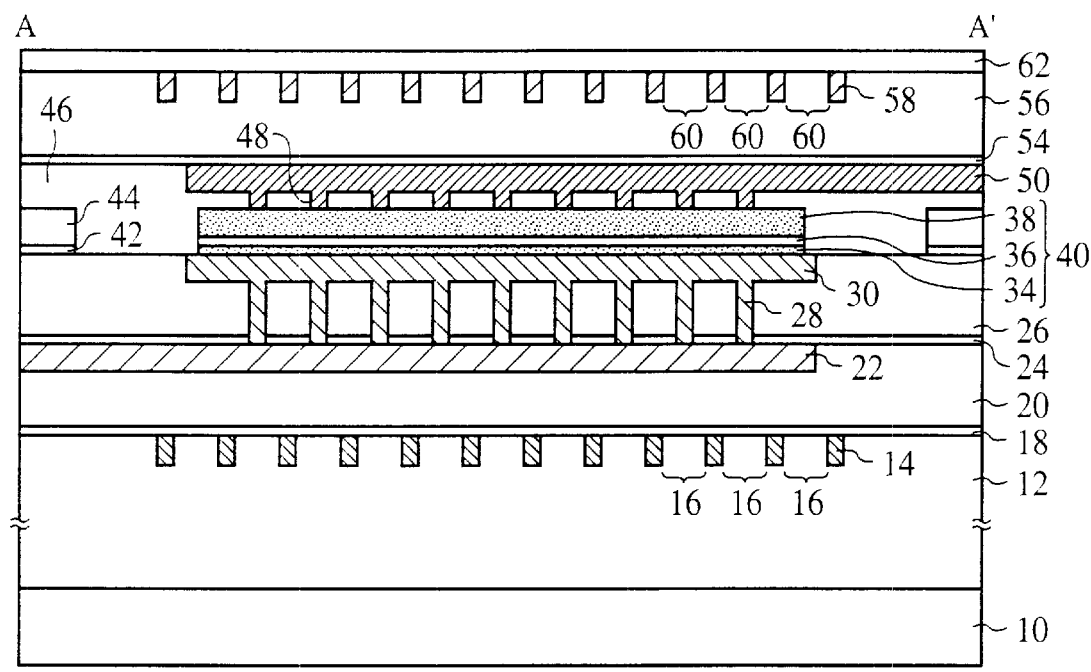
FIG. 19 is sectional view of the semiconductor device according to the first embodiment of the present invention, which show the method for fabricating the semiconductor device (Part 16).

Next, as shown in FIG. 18B, a 600 nm-thickness Cu layer 106 is formed on the entire surface by plating.

Then, the Cu layer 106 is polished by CMP until the surface of the inter-layer insulation film 56 is exposed to bury the upper shield layer 58 of the Cu in the mesh-groove 104 (see FIG. 19).

Next, the cap layer 62 is formed of 150 nm-thickness SiN on the entire surface.

Thus, the semiconductor device according to the present embodiment can be fabricated.

The method for fabricating the semiconductor device according to the present embodiment is characterized mainly in that the insulation film 44 having a height substantially equal to a height of the upper surface of the MIM capacitor 40, and the inter-layer insulation film 46 is formed without removing the insulation film 44 after the MIM 40 has been formed.

When materials of interconnection layers, etc. are Cu, etc., the interconnection layers, etc. are buried in inter-layer insulation films by damascene method. To bury interconnection layers, etc. in inter-layer insulation films by damascene method, the surfaces of the inter-layer insulation film is must be flat. When an inter-layer insulation film is simply formed above an MIM capacitor, the surface of the inter-layer insulation film is raised, forming a step on the surface of the inter-layer insulation film. The step exceeds a limit which can be planarized by CMP. Accordingly, when an inter-layer insulation film is simply formed above an MIM capacitor, damascene method has found it difficult to bury an interconnection layer, etc. in the inter-layer insulation film.

When materials of interconnection layers, etc. are easy to etch, damascene method may not be used. Accordingly, the interconnection layers, etc. can be formed on an inter-layer insulation film having a step formed on the surface. However, when an interconnection layer, etc. are formed on an inter-layer insulation film with a step formed on the surface, there is a risk that the inter-connection layer, etc. might be broken, and the reliability cannot be high. When a step is formed on the surface, it is difficult to ensure a focal depth in photolithography, which makes it difficult to form a micronized pattern. Accordingly, layers on which MIM capacitors can be formed have been conventionally limited to ones near the uppermost layers.

However, in the present embodiment, the insulation film 44 having a height substantially equal to a height of the upper surface of the MIM capacitor 40 is formed around the MIM capacitor 40 is formed, whereby the surface of the inter-layer insulation film 46 can be prevented from rising above the MIM capacitor 40, and a height of the surface of the inter-layer insulation film 46 can be made generally substantially uniform. Thus, according to the present embodiment, the surface of the inter-layer insulation film 46 can be planarized by CMP, and the upper electrode lead-out interconnection layer 50, etc. can be buried in the inter-layer insulation film 46, etc. by damascene method. Thus, according to the present embodiment, a material of the upper electrode lead-out interconnection layer 50, etc. can be Cu, etc.

According to the present embodiment, the upper electrode lead-out interconnection layer 50 can be buried in the inter-layer insulation film 46 whose surface is flat, whereby breakage, etc. of the upper electrode lead-out interconnection layer 50 can be prevented, and high reliability can be obtained.

According to the present embodiment, the inter-layer insulation film 46, etc. can be formed on the MIM capacitor 40 flat, which makes it possible to form micronized patterns in layers upper of the MIM capacitor 40, which permits the MIM capacitor 40 to be formed in any region other than a vicinity of the uppermost layer.

According to the present embodiment, the MIM capacitor 40 can be formed in any region other than a vicinity of the uppermost layer, which makes it possible to form the upper shield layer 58, etc. above the MIM capacitor 40 and the upper electrode interconnection layer 50.

According to the present embodiment, the insulation film 44 also functions as the hard mask for patterning the cap layer 42. Accordingly, the present embodiment can form the inter-layer insulation film 46 whose height of the upper surface is substantially uniform without adding any step.

(Modification 1)

Figure 20:
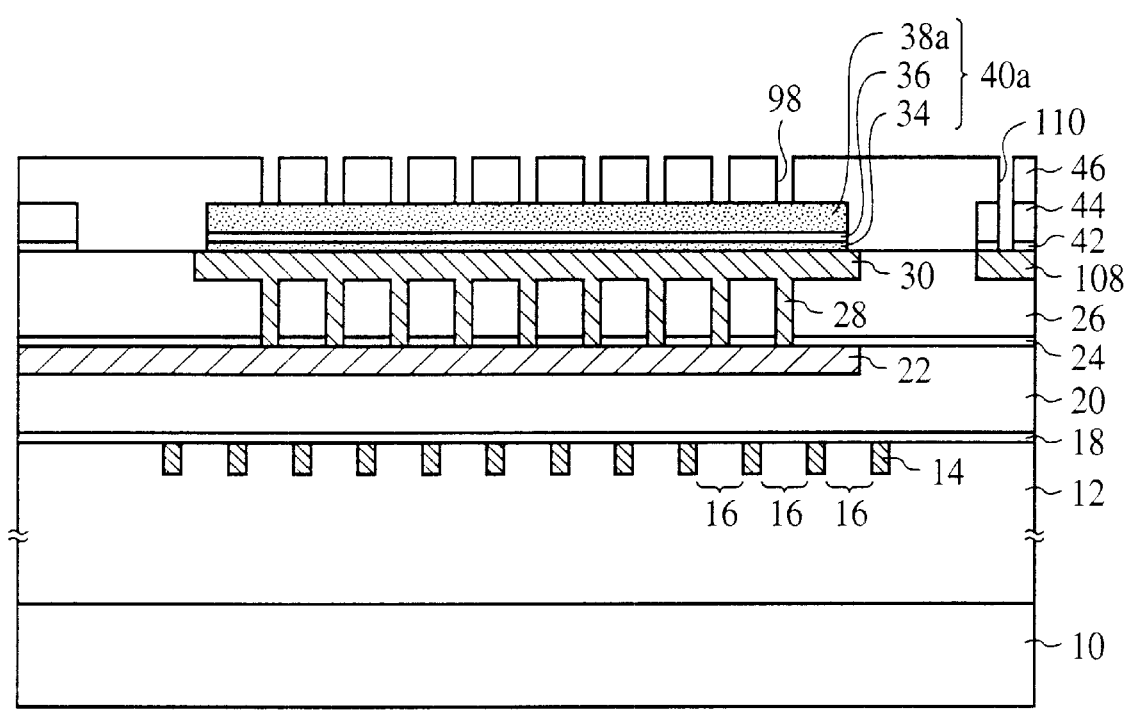
FIG. 20 is a sectional view of the semiconductor device according to one example (Modification 1) of modifications of the first embodiment of the present invention in the step of the method for fabricating the same.

Next, the semiconductor device according to a modification (Modification 1) of the present embodiment will be explained with reference to FIG. 20. FIG. 20 is a sectional view of the semiconductor device according to Modification 1.

The semiconductor device according to the present modification is characterized mainly in that a thickness of an upper electrode 38a of an MIM capacitor 40a is as thick as 200 nm.

As shown in FIG. 20, in a case that an interconnection layer 108 is buried in an inter-layer insulation film 26, a contact hole 110 must be formed down to the interconnection layer 108 so as to electrically connect an upper interconnection layer (not shown) to the interconnection layer 108.

The contact hole 110 down to the interconnection layer 108 is formed by etching the inter-layer insulation film 46 and the insulation film 44 with a cap layer 42 as an etching stopper and further etching the exposed cap layer 42.

However, the surface of the upper electrode 38a of the MIM capacitor 40a exposed in the contact holes 98 is often etched in the process of forming the contact hole 110, because the depth of the contact holes 98 down to the upper electrode 38a of the MIM capacitor 40a is larger than that of the contact hole 110 down to the interconnection layer 108. In such case, when a thickness of the upper electrode 38a of the MIM capacitor 40a is small, the contact hole 98 passes through the upper electrode 38a of the MIM capacitor 40a down to a capacitor insulation film 36.

Then, in the present modification, a thickness of the upper electrode 38a of the MIM capacitor 40a is set to be large, whereby the contact hole 98 is prevented from passing through the upper electrode 38 of the MIM capacitor 40a down to the capacitor insulation film 36 in the process of forming the contact hole 110.

It is preferable that a thickness of the insulation film 44 is made large in accordance with a large thickness of the upper electrode 38a, so that a height of the insulation film 44 and a height of the MIM capacitor 40a are made equal to each other.

As described above, according to the present modification, the upper electrode 38a of the MIM capacitor 40a is formed thick, whereby even in a case that the contact hole 110 is formed deep down to the interconnection layer 108, the contact hole 98 is prevented from passing through the upper electrode 38 of the MIM capacitor 40a down to the capacitor dielectric film 36.

(Modification 2)

Figure 21:
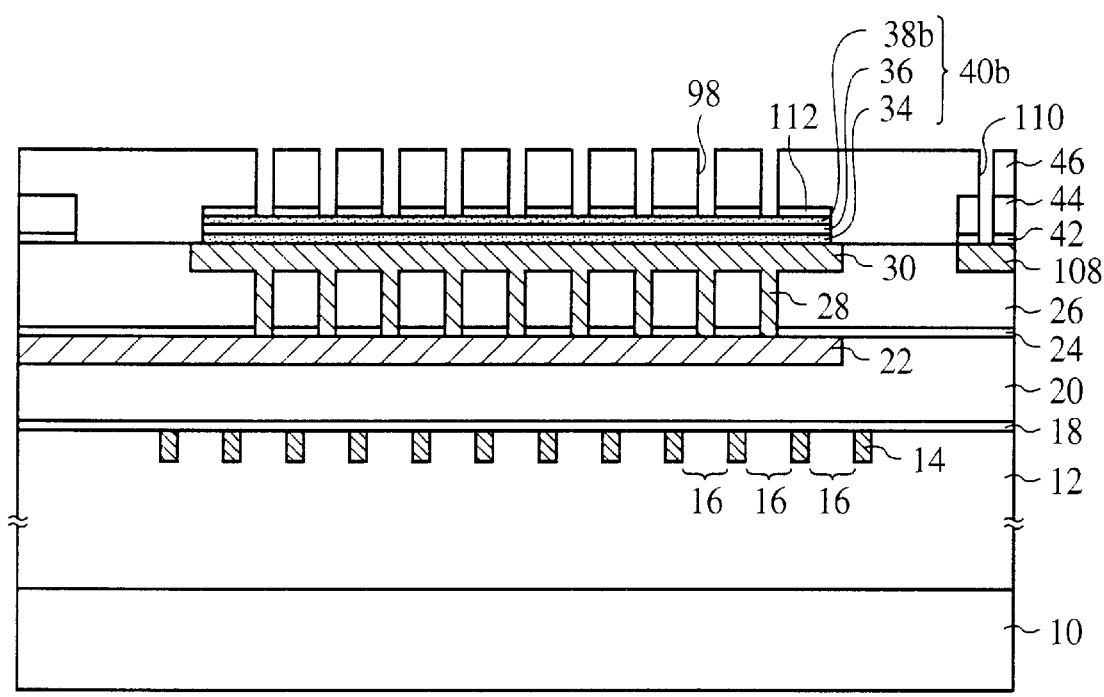
FIG. 21 is a sectional view of the semiconductor device according to another example (Modification 2) of modifications of the first embodiment of the present invention.

Then, the semiconductor device according to Modification 2 of the present embodiment will be explained with reference to FIG. 21. FIG. 21 is a sectional view of the semiconductor device according to the present modification.

The semiconductor device according to the present modification is characterized mainly in that an etching stopper film 112 is formed on an MIM capacitor 40b.

As shown in FIG. 21, in the present modification, the etching stopper film 112 of a 50 nm-thickness SiN film is formed on the MIM capacitor 40b.

In the semiconductor device shown in FIG. 20, the upper electrode 38a of the MIM capacitor 40a is formed thick, whereby the contact hole 98 is prevented from passing through the upper electrode 38a of the MIM capacitor 40b down to the capacitor insulation film 36. However, in the present embodiment, the etching stopper film 112 is formed on the upper electrode 38b of the MIM capacitor 40b, whereby the contact hole 98 is prevented from passing through the upper electrode 38b of the MIM capacitor 40b down to the capacitor insulation film 36.

Thus forming the etching stopper film 112 on the MIM capacitor 40b also prevents the contact hole 98 from passing through the upper electrode 38b of the MIM capacitor 40b down to the capacitor insulation film 36.

Second Embodiment

Figure 22:
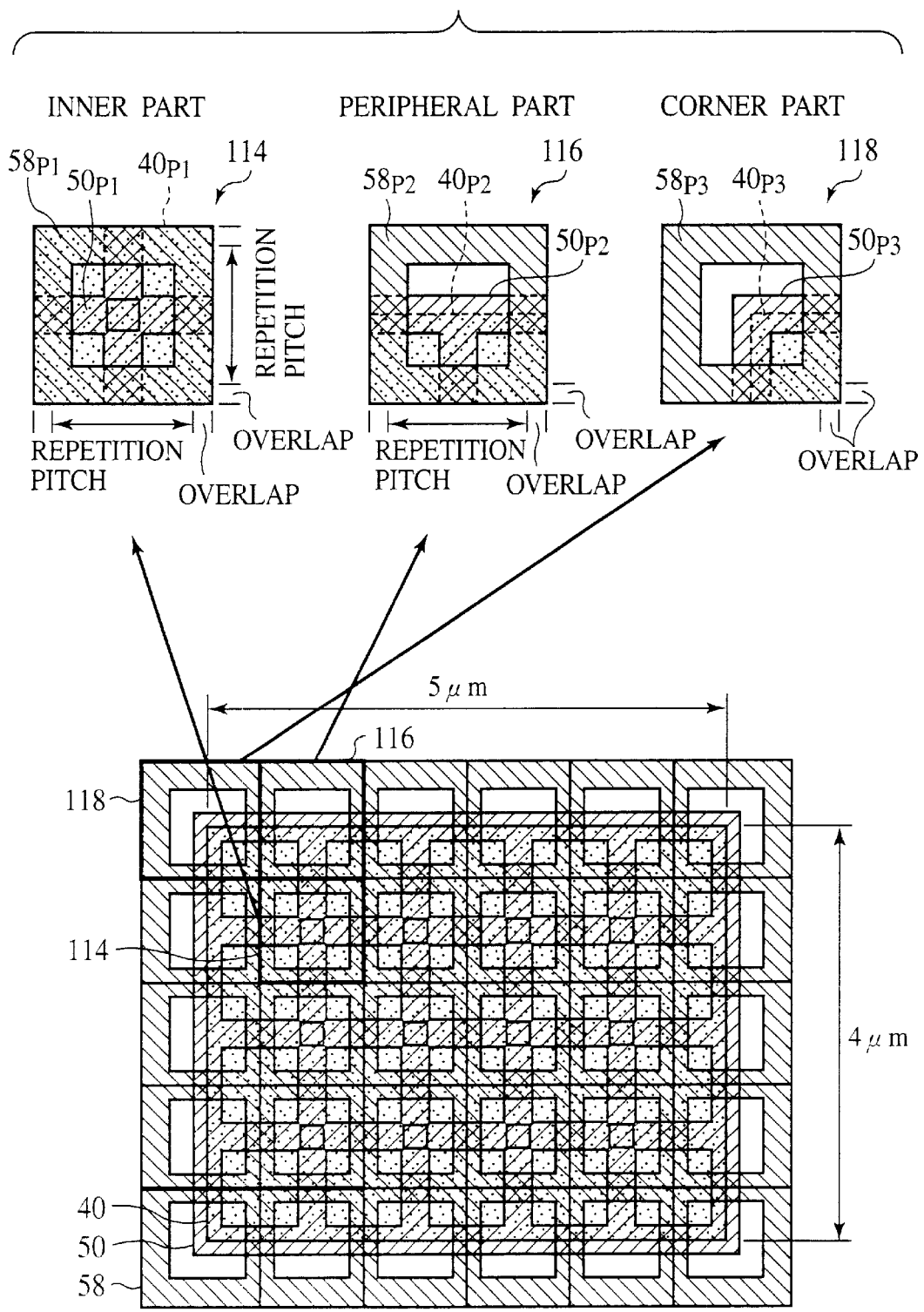
FIG. 22 is plan views of a layout of patterns of the semiconductor device according to a second embodiment of the present invention.

The semiconductor device according to a second embodiment of the present invention will be explained with reference to FIG. 22. FIG. 22 is plan views showing a layout of a pattern of the semiconductor device according to the present embodiment. The same members of the present embodiment as those of the semiconductor device according to the first embodiment and the method for fabricating the same shown in FIGS. 1 to 21 are represented by the same reference numbers not to repeat or to simplify their explanation.

The semiconductor device according to the present embodiment has a region for the MIM capacitor, the lead-out interconnection layers, the shield layers, etc. to be formed in are divided in inner basic blocks 114, peripheral basic blocks 116 and corner basic blocks 118, and the basic blocks 114, 116, 118 are suitably combined to form the MIM capacitor, the lead-out interconnection layers, the shield layers, etc.

The inner basic blocks 114 are basic blocks for forming an inner part of the MIM capacitor 40. A pattern of each inner basic block 114 has a basic pattern $40_{P1}$ forming an inner part of the MIM capacitor 40, a basic pattern $50_{P1}$ forming an inner part of the upper electrode lead-out interconnection layer 50, a basic pattern $58_{P1}$ forming an inner part of the lower electrode lead-out interconnection layer 50, a basic pattern (not shown) forming an inner part of the lower electrode lining interconnection layer 30, a basic pattern (not shown) forming an inner part of the lower electrode lead-out interconnection layer 22, and a basic pattern (not shown) forming an inner part of the lower shield layer 14. A configuration of the basic pattern forming the inner part of the lower electrode lining interconnection layer 30 and a configuration of the basic pattern forming the inner part of the lower electrode lead-out interconnection layer 22 are the same as a configuration of the basic pattern $50_{P1}$ forming the inner part of the upper electrode lead-out interconnection layer 50. A configuration of the basic pattern forming the inner part of the lower shield layer 14 is the same as a configuration of the basic pattern $58_{P1}$ forming the inner part of the upper shield layer 58.

The peripheral basic blocks 116 are basic block forming a part containing a peripheral edge of the MIM capacitor 40. A pattern of the peripheral basic block 116 has a basic pattern $40_{P2}$ forming a part containing a peripheral edge of the MIM capacitor 40, a basic pattern $50_{P2}$ forming a part containing a peripheral edge of the upper electrode lead-out interconnection layer 50, a basic pattern $58_{P2}$ forming a part containing a peripheral edge of the upper shield layer 58, a basic pattern (not shown) forming a part containing a peripheral edge of the lower electrode lining interconnection layer 30, a basic pattern (not shown) forming a part containing a peripheral edge of the lower electrode lead-out interconnection layer 22, and a basic pattern (not shown) forming a part containing a peripheral edge of the lower shield layer 14. A configuration of the basic pattern forming a part containing a peripheral edge of the lower electrode lining interconnection layer 30 and a configuration of the basic pattern forming a part containing a peripheral edge of the lower electrode lead-out interconnection layer 22 are the same as a configuration of the basic pattern $50_{P2}$ forming a part containing a peripheral edge of the upper electrode lead-out interconnection layer 50. A configuration of the basic pattern forming a part containing a peripheral edge of the lower shield layer 14 is the same as a configuration of the basic pattern $58_{P2}$ forming a part containing a peripheral edge of the upper shield layer 58.

The corner basic blocks 118 are basic blocks forming the parts containing the corners of MIM capacitor 40. A pattern of each corner basic block 118 has a basic pattern $40_{P3}$ forming a part containing a corner of the MIM capacitor 40, a basic pattern $50_{P3}$ forming a part containing a corner of the upper electrode lead-out interconnection layer 50, a basic pattern $58_{P3}$ forming a part containing a corner of the upper shield layer 58, a basic pattern (not shown) forming a part containing a corner of the lower electrode lining interconnection layer 30, a basic pattern (not shown) forming a part containing a corner of the lower electrode lead-out interconnection layer 22, and a basic pattern forming a part containing the corner of the lower shield layer 14. A configuration of the basic pattern forming a part containing a corner of the lower electrode lead-out interconnection layer 30 and a configuration of the basic pattern forming a part containing a corner of the lower electrode lead-out interconnection layer 22 are the same as a configuration of the basic pattern $50_{P3}$ forming a part containing a corner of the upper electrode lead-out interconnection layer 50. A configuration of the basic pattern forming a part containing the corner of the lower electrode lead-out interconnection layer 22 are the same as a configuration of the basic pattern $58_{P3}$ forming a part containing a corner of the upper shield layer 58.

A repetition pitch of the inner basic blocks 114, the peripheral basic blocks 116 and the corner basic blocks 118 are set to be, e.g., 1 µm. Here, a repetition pitch is a pitch at which the patterns of the basic blocks 114, 116, 118 are repeatedly arranged.

The basic patterns of the inner basic blocks 114 are arranged in the inner region of the MIM capacitor 40 in, e.g., horizontally 4 blocks and vertically 3 blocks.

The basic patterns of the peripheral basic blocks 116 are arranged in a region containing the peripheral edge of the MIM capacitor 40 in, e.g., totally in a number of 14 blocks.

The basic patterns of the corner basic blocks 118 are arranged in a region containing the corners of the MIM capacitor 40 totally in a number of 4 blocks.

The patterns of the basic blocks 114, 116, 118 are thus combined to thereby form, e.g., a 5 µm-width and a 4 µm-length pattern of the MIM capacitor 40. Here, an overlap between the basic blocks 114, 116, 118 is set to be 0 µm.

A capacitance C of the MIM capacitor 40 formed by arranging the basic blocks 114, 116, 118 is expressed by $$C = C_1 \times n_1 \times C_2 \times n_2 \times C_3 \times n_3$$

where $C_1$ is a capacitance of the MIM capacitor 40 obtained by arranging one inner basic block 114, $C_2$ is a capacitance of the MIM capacitor 40 obtained by arranging one peripheral basic block 116, $C_3$ is a capacitance of the MIM capacitor 40 obtained by arranging one corner basic block 118 and when a number of arranged inner basic blocks 141 is $n_1$, a number of arranged peripheral basic block is $n_2$, and a number of arranged corner basic blocks is $n_3$.

As seen in FIG. 22, an area of the basic patterns $40_{P2}$ of the parts of the peripheral basic blocks 116, which form the MIM capacitor 40 is ½ of an area of the basic pattern $40_{P1}$ of the parts of the inner basic blocks 114, which form the MIM capacitor 40. Then, a capacitance $C_2$ of the MIM capacitor 40 obtained arranged by arranging one peripheral basic block 116 is expressed by $$C_2 = C_1/2.$$

As seen in FIG. 22, an area of the corner basic blocks 118 forming a part of the MIM capacitor, 40 is ¼ of an area of the basic patterns $40_{P1}$ of the inner basic blocks 114 forming the MIM capacitor 40. Then, a capacitance $C_3$ of the MIM capacitor 40 obtained by arranging one corner basic block 118 is expressed by $$C_3 = C_1/4.$$

As described above, in the present embodiment, a number $n_1$ of the arranged inner basic blocks 114 is 12, a number $n_2$ of the arranged peripheral basic blocks 116 is 14, and a number $n_3$ of the arranged corner basic blocks 118 is 4.

Then, a capacitance C of the MIM capacitor 40 is $$C = C_1 \times n_1 = C_2 \times n_2 + C_3 \times n_3 = C_1 \times 12 + (C_1/2) \times 14 + (C_1/4) \times 4 = C_1 \times 20.$$

Here, when a capacitance $C_1$ is, e.g., 1 pF, a capacitance C of the MIM capacitor 40 can be easily calculated at 20 pF by the above formula.

As described above, according to the present embodiment, based on capacitances $C_1$, $C_2$, $C_3$ provided by respective arrangements of the basic blocks 114, 116, 118, and respective numbers of arranged basic blocks 114, 116, 118, a capacitance C of the MIM capacitor 40 can be easily calculated.

It is preferable that widths of the basic patterns are set so as to satisfy design rules, such as a maximum interconnection width, a minimum interconnection width, a minimum interconnection gap, area occupation ratios of the interconnection layers, etc. For example, limitations, as of a maximum interconnection layer width, a minimum interconnection layer width and a minimum interconnection gap, and others can be sufficiently satisfied by setting a repetition pitch of the basic blocks at 1 µm, an interconnection width at 0.4 µm and a repetition pitch at 1 µm when a limitation of the maximum interconnection width is 2 µm, a limitation of the minimum interconnection width is 0.3 µm, a limitation of the minimum interconnection layer gap is 0.3 µm, and a limitation of the area occupation ration of the interconnection layer is 30 to 80% in a 20 µm□ region. In this case, in the inner basic blocks 114, an area occupation ratio of the patterns of the lead-out interconnection layer and the shield layers can be, e.g., about 64% in a 1 µm□ region.

As seen in FIG. 22, in the peripheral basic blocks 116 and the corner basic block 118, an area occupation ratio of the interconnection layers is lower in comparison with that of the inner basic blocks 114, without any remarkable problem; an area occupation ratio in a micronized region of about 1 µm□ does not have to be essentially satisfied. When an area occupation ratio in a 1 µm□ micronized region must be satisfied, dummy patterns may be arranged in the peripheral basic blocks 116 and the corner basic blocks 118.

As described above, according to the present embodiment, a plurality of the basic blocks are suitably arranged to thereby form patterns of the MIM capacitor, the lead-out interconnection layers, the shield layers, etc. Patterns of the MIM capacitor, the lead-out interconnection layers, the shield layers, etc., can be easily formed by means of CAD, etc.

According to the present embodiment, based on capacitances $C_1$, $C_2$, $C_3$ provided by respective arrangements of the basic blocks and respective numbers of arranged basic blocks $n_1$, $n_2$, $n_3$, a capacitance C of the MIM capacitor can be easily calculated, which facilitates the design.

(Modification)

Figure 23:
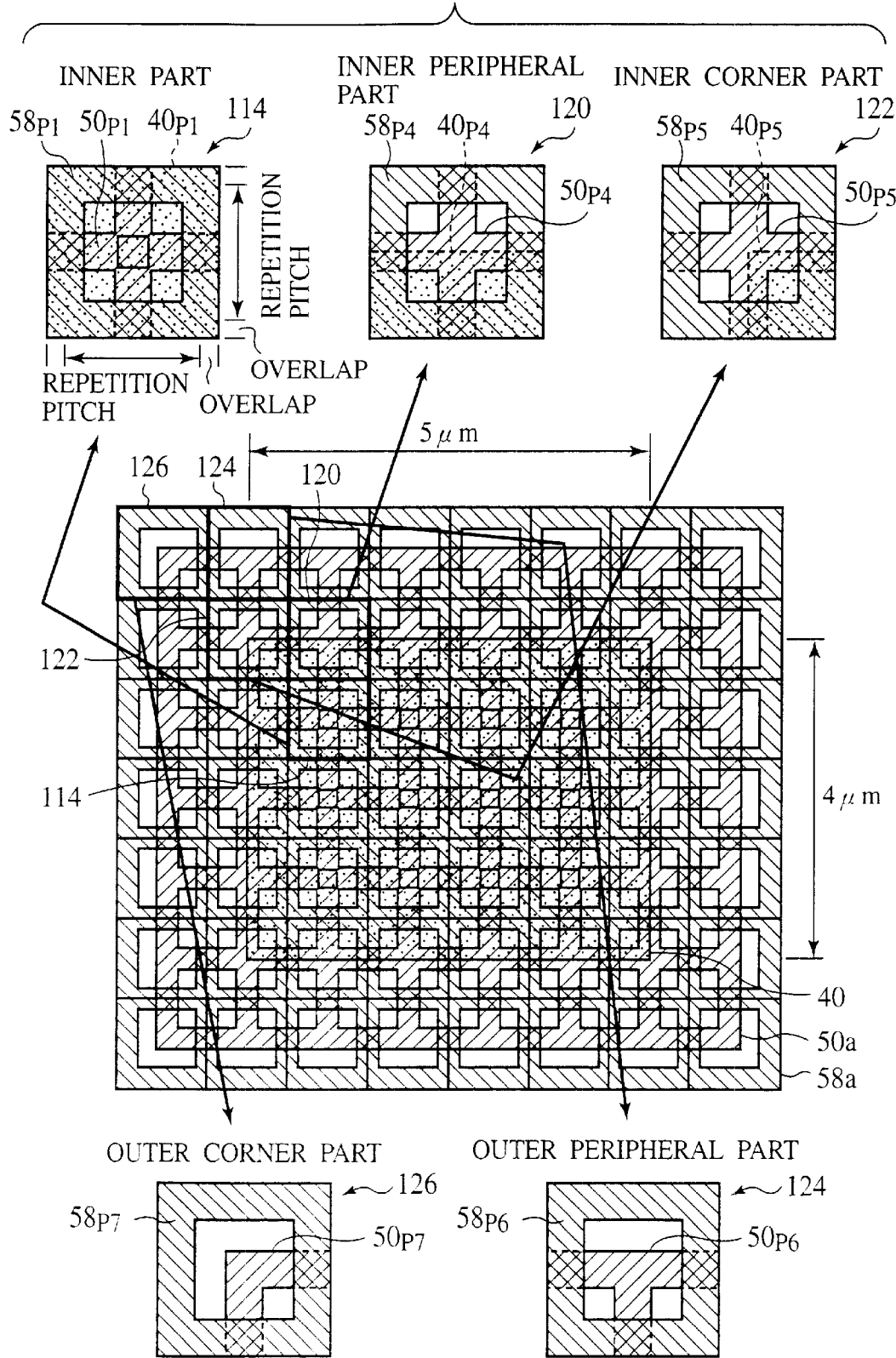
FIG. 23 is plan views of a layout of patterns of the semiconductor device according to a modification of the second embodiment of the present invention.

Then, a modification of the semiconductor device according to the present embodiment and the method for fabricating the same will be explained with reference to FIG. 23. FIG. 23 is plan views of a layout of patterns of the semiconductor device according to the present modification.

As shown in FIG. 23, the semiconductor device according to the present modification is mainly characterized in that shield layers are formed larger than a size of an MIM capacitor.

The semiconductor device according to the present modification is characterized mainly in that a region for the MIM capacitor 40, etc. to be formed in is divided in inner basic blocks 114, inner peripheral basic blocks 120, inner corner basic blocks 122, outer peripheral basic blocks 124 and outer corner basic blocks 126. The basic blocks 114, 120, 122, 124, 126 are suitably combined to form the MIM capacitor 40, etc.

The inner basic blocks 114 are the same as the inner basic blocks 114 which have been explained above with reference to FIG. 22, and their explanation will not be repeated.

The inner peripheral basic blocks 120 are basic blocks for forming a part containing a peripheral edge of the MIM capacitor 40. A pattern of each inner peripheral basic block 120 has a basic pattern $40_{P4}$ forming a part of a peripheral edge of the MIM capacitor 40, a basic pattern $50_{P4}$ for forming a inner part of an upper electrode lead-out interconnection layer 50a, a basic pattern $58_{P4}$ for forming a part containing a peripheral edge of the upper shield layer 58a, a basic pattern (not shown) for forming an inner part of a lower electrode lining interconnection layer (not shown), and a basic pattern (not shown) for forming an inner part of a lower electrode lead-out interconnection layer (not shown), and a basic pattern (not shown) for forming an inner part of the lower shield layer (not shown). A configuration of the basic pattern for forming an inner part of the lower electrode lining interconnection layer and a configuration of the basic pattern for forming an inner part of the lower electrode lead-out interconnection layer are the same as a configuration of the basic pattern $50_{P4}$ for forming an inner part of the upper electrode lead-out interconnection layer 50a. A configuration of the basic pattern for forming an inner part of the lower shield layer is the same as a configuration of the basic pattern $58_{P4}$ for forming a part containing a peripheral edge of the upper shield layer 58a.

The basic blocks 122 for the inner corners are basic blocks for forming parts containing the corners of the MIM capacitor 40. A pattern of the corner basic block 122 has a basic pattern $40_{P5}$ for forming a part containing a corner of the MIM capacitor 40, a basic pattern $50_{P5}$ for forming an inner part of the upper electrode lead-out interconnection layer 50a, a basic pattern $58_{P5}$ for forming an inner part of the upper shield layer 58a, a basic pattern (not shown) for forming an inner part of the lower electrode lining interconnection layer (not shown), a basic pattern (not shown) for forming an inner part of the lower electrode lead-out interconnection layer (not shown), and a basic pattern (not shown) for forming an inner part of the lower shield layer (not shown). A configuration of the basic pattern for forming an inner part of the lower electrode lining interconnection layer and a configuration of the basic pattern for forming an inner part of the lower electrode lead-out interconnection layer are the same as a configuration of the basic pattern $50_{P5}$ for forming an inner part of the upper electrode lead-out interconnection layer 50a. A configuration of the basic pattern for forming an inner part of the lower shield layer is the same as a configuration of the basic pattern $58_{P5}$ for forming an inner part of the shield layer 58a.

The outer peripheral basic blocks 124 are basic blocks for forming a part of the peripheral edge of the upper electrode lead-out interconnection layer 50a. A pattern of the outer peripheral basic blocks 124 has a basic pattern $50_{P6}$ for forming a part containing a peripheral edge of the upper electrode lead-out interconnection layer 50a, a basic pattern $58_{P6}$ for forming a part containing a peripheral edge of the upper shield layer 58a, a basic pattern (not shown) for forming a part containing a peripheral edge of the lower electrode lining interconnection layer (not shown), a basic pattern (not shown) for forming a part containing a peripheral edge of the lower electrode lead-out interconnection layer (not shown), and a basic pattern for forming a part of a peripheral edge of the lower shield layer (not shown). A configuration of the basic pattern for forming a part containing a peripheral edge of the lower electrode lining interconnection layer and a configuration of the basic pattern for forming a part containing a peripheral edge of the lower electrode lead-out interconnection layer are the same as a configuration of the basic pattern $50_{P6}$ for forming a part containing a peripheral edge of the upper electrode lead-out interconnection layer 50a. A configuration of the basic pattern for forming a part containing a peripheral edge of the lower shield layer is the same as a configuration of the basic pattern $58_{P6}$ for forming a part containing a peripheral edge of the upper shield layer 58a.

The outer corner basic blocks 126 are basic blocks for forming a part containing the corners of the upper electrode lead-out interconnection layer 50a. A pattern of each outer corner basic block 124 has a basic pattern $50_{P7}$ for forming a part containing a corner of the upper electrode lead-out interconnection layer 50a, a basic pattern $58_{P7}$ for forming a part containing a corner of the upper shield layer 58a, a basic pattern (not shown) for forming a part containing a corner of the lower electrode lining interconnection layer (not shown), a basic pattern (not shown) for forming a part containing a corner of the lower electrode lead-out interconnection layer 22 and a basic pattern (not shown) for forming a part containing a corner of the lower shield layer (not shown). A configuration of the basic pattern for forming a part containing a corner of the lower electrode lining interconnection layer and a configuration of the basic pattern for forming a part containing a corner of the lower electrode lead-out interconnection layer are the same as a configuration of the basic pattern $50_{P7}$ for forming a part containing a corner of the upper electrode lead-out interconnection layer 50a. A configuration of the basic pattern for forming a part containing a corner of the lower shield layer is the same as a configuration of the basic pattern $58_{P7}$ for forming a part containing a corner of the upper shield layer 58a.

As described above, according to the present modification, the shield layers are formed larger than the MIM capacitor 40, whereby the combination of noises with the MIM capacitor can be prevented.

Third Embodiment

Figure 24:
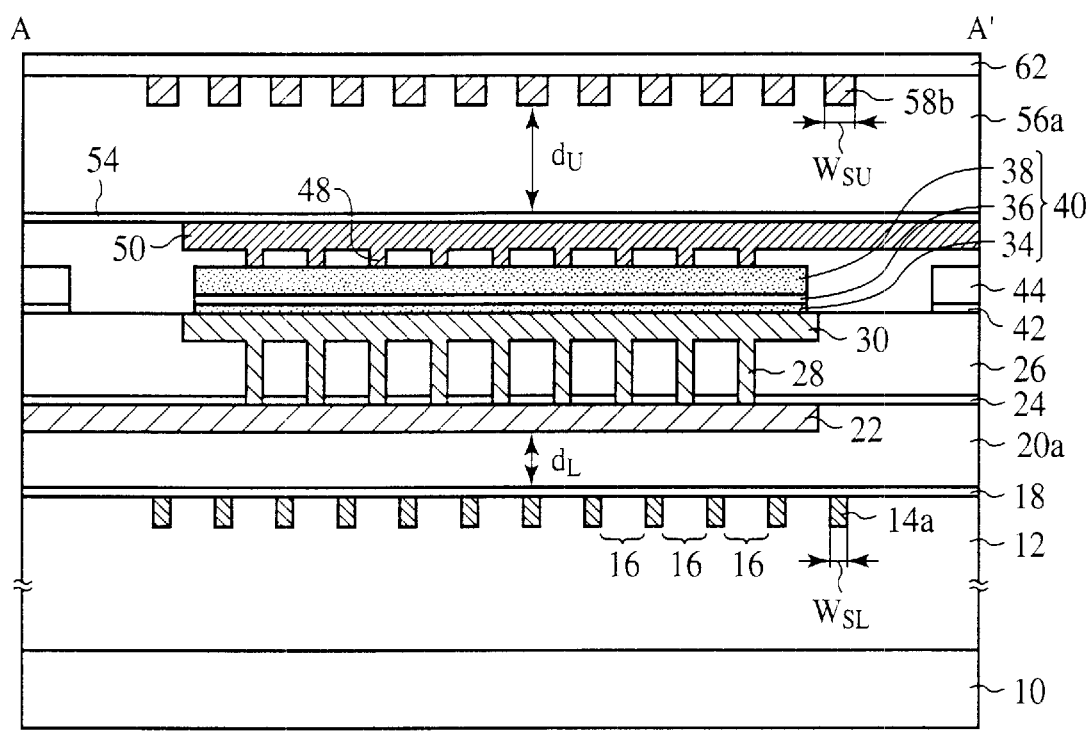
FIG. 24 is a sectional view of the semiconductor device according to a third embodiment of the present invention.
Figure 25A:
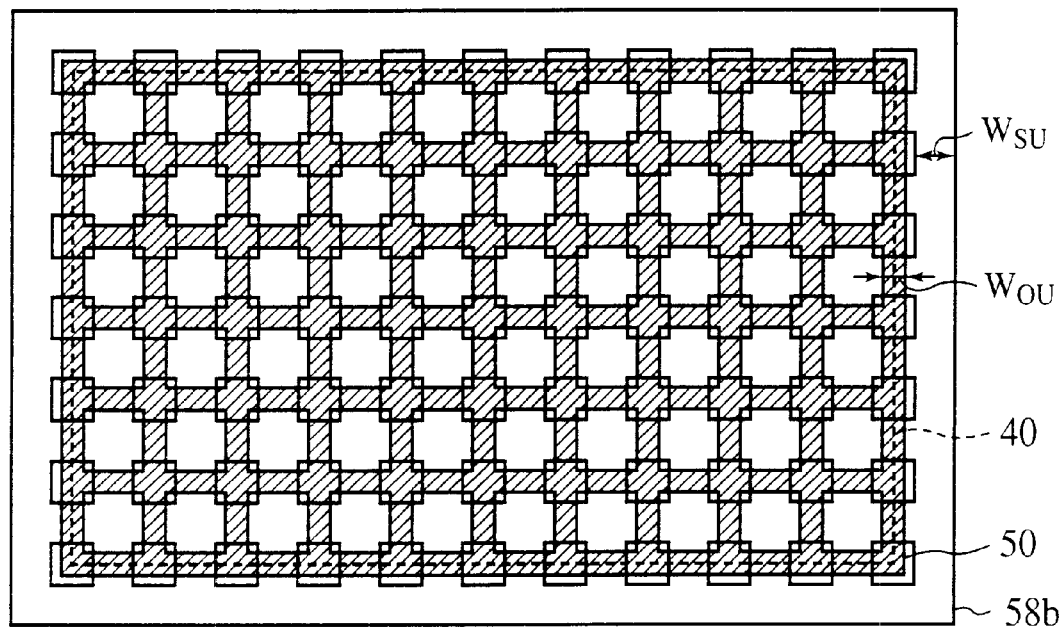
FIGS. 25A and 25B are plan views of the semiconductor device according to a third embodiment of the present invention.
Figure 25B:
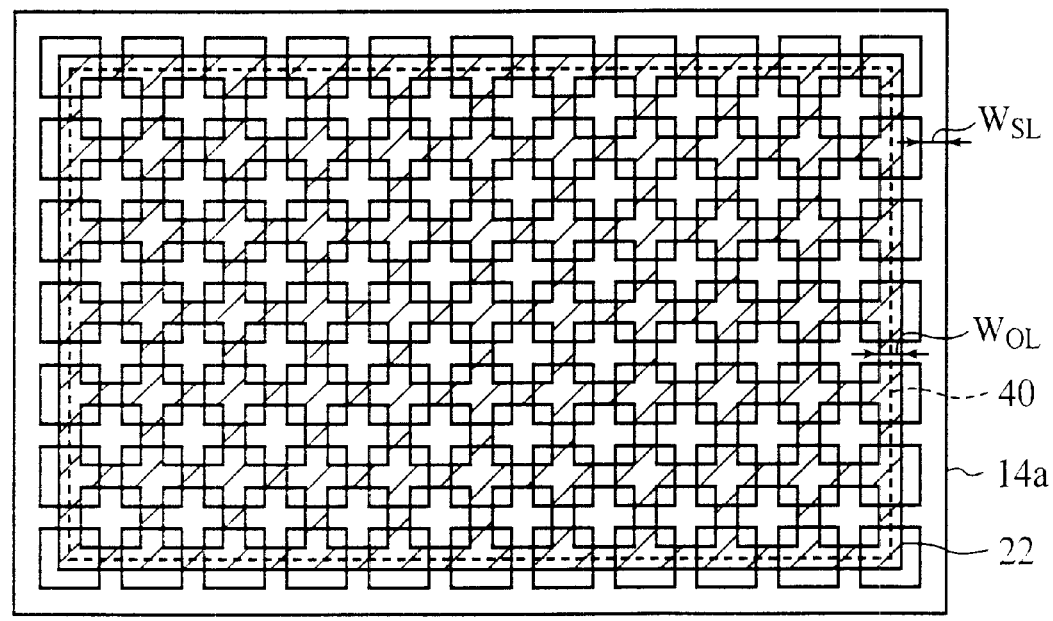

The semiconductor device according to a third embodiment of the present invention will be explained with reference to FIGS. 24 to 25B. FIG. 24 is a sectional view of the semiconductor device according to the present embodiment. FIGS. 25A and 25B are views of the semiconductor device according to the present embodiment. FIG. 25A is a plan view showing an upper shield layer, an upper electrode lead-out interconnection layer and an MIM capacitor. FIG. 25B is a plan view of a lower shield layer, a lower electrode lead-out interconnection layer and the MIM capacitor. The same members of the present embodiment as those of the semiconductor device according to the first or the second embodiment and the method for fabricating the same, which are shown in FIGS. 1 to 23 are represented by the same reference numbers not to repeat or to simplify their explanation.

The semiconductor device according to the present embodiment is characterized mainly in that in a case that a gap between the lower electrode lead-out interconnection layer 22 and the lower shield layer 14a is different from a gap between the upper electrode lead-out interconnection layer 50 and the upper shield layer 58b, a width of a pattern of the lower shield layer 14a and a width of a pattern of the upper shield layer 58b are different from each other, whereby a parasitic capacity between the lower electrode lead-out interconnection layer 22 and the lower shield layer 14a is set to be substantially equal to a parasitic capacity between the upper electrode lead-out interconnection layer 50 and the upper shield layer 58b.

As shown in FIG. 25, a width $w_{SL}$ of a mesh-pattern of the lower shield layer 14a is set to be, e.g., 0.3 µm.

A width $w_{OL}$ of a mesh-pattern of the lower electrode lead-out interconnection layer 22 is set to be, e.g., 0.4 µm.

A width of a mesh-pattern of the lower electrode lining interconnection layer 30 is set to be substantially equal to a width of the mesh-pattern of the lower electrode lead-out interconnection layer 22.

A thickness $d_L$ of an inter-layer insulation film 20a is, e.g., 400 nm.

A thickness $d_U$ of an inter-layer insulation film 56a is, e.g., 800 nm.

The inter-layer insulation film 20a and the inter-layer insulation film 56 are formed of the same material, and a dielectric constant ∈ of the inter-layer insulation film 20a and a dielectric constant ∈ of the inter-layer insulation film 56a are equal to each other.

A width $w_{OU}$ of an upper electrode lead-out interconnection layer 50 is set to be, e.g., 0.4 µm.

A width $w_{SU}$ of a mesh-pattern of the upper shield layer 58 is set to be, e.g., 0.6 µm.

Method for designing widths of the mesh-patterns of the lower shield layer 14, the lower electrode lead-out interconnection layer 22, the upper electrode lead-out interconnection layer 50 and the upper shield layer 58 will be explained.

An opposed area between the lower electrode lead-out interconnection layer 22 and the lower shield layer 14a is $S_L$, and an opposed area between the upper electrode lead-out interconnection layer 50 and the upper shield layer 58b is $S_U$. A parasitic capacity between the lower electrode lead-out interconnection layer 22 and the lower shield layer 14a is $C_L$, and a parasitic capacity between the upper electrode lead-out interconnection layer 50 and the upper shield layer 58b is $C_U$.

A parasitic capacity $C_L$ between the lower electrode lead-out interconnection layer 22 and the lower shield layer 14a is expressed by $$C_L = \in \times (S_L/d_L).$$

A parasitic capacity $C_U$ between the upper electrode lead-out interconnection layer 50 and the upper shield layer 58b is expressed by $$C_U = \in \times (S_U/d_U).$$

Here, when $d_L/d_U = a$, for $C_L = C_U$, it is necessary that $S_L/S_U = a$.

When a number of parts where the mesh-pattern of the lower electrode lead-out interconnection layer 22 and the mesh-pattern of the lower shield layer 14a are opposed to each other is n, an opposed area $S_L$ is expressed by $$S_L = n \times (w_{OL} \times w_{SL}).$$

When a number of parts where the mesh-pattern of the upper electrode lead-out interconnection layer 50 and the mesh-pattern of the upper shield layer 58b are opposed to each other is n, an opposed area $S_U$ is expressed by $$S_U = n \times (w_{OU} \times w_{SU}).$$

Widths of the mesh-patterns of the lower shield layer 14a, the lower electrode lead-out interconnection layer 22, the upper electrode lead-out interconnection layer 50 and the upper shield layer 58b are set respectively to be $$S_L/S_U = (w_{OL} \times w_{SL})/(w_{OL} \times w_{SU}) = a.$$

The mesh-patterns must be set so as to satisfy the above-described design rules. However, as described above, there is no remarkable problem to satisfy the above-described design rules when a width $w_{SL}$ of the mesh-pattern of the lower shield layer 14a is 0.3 µm, a width $w_{OL}$ of the mesh-pattern of the lower electrode lead-out interconnection layer 22 is 0.4 µm, a width $w_{OU}$ of the upper electrode lead-out interconnection layer 50 is 0.4 µm, and a width $w_{SU}$ of the mesh-pattern of the upper shield layer 58b is 0.6 µm.

As described above, according to the present embodiment, even in a case that a gap $d_L$ between the lower shield layer 14a and the lower electrode lead-out interconnection layer 22 is different from a gap $d_U$ between the upper electrode lead-out interconnection layer 50 and the upper shield layer 58b, a width $w_{SL}$ of the lower shield layer 14a and a width $w_{SU}$ of the upper shield layer 58a are made different from each other, whereby a parasitic capacity $C_L$ between the lower shield layer 14a and the lower electrode lead-out interconnection layer 22 and a parasitic capacity $C_U$ between the upper electrode lead-out interconnection layer 50 and the upper shield layer 58a can be set to be equal to each other. According to the present embodiment, a parasitic capacity $C_L$ between the lower shield layer 14a and the lower electrode lead-out interconnection layer 22 and a parasitic capacity $C_U$ between the upper electrode lead-out interconnection layer 50 and the upper shield layer 58b are made substantially equal to each other, whereby electric characteristic symmetry can be improved.

(Modification)

Figure 26:
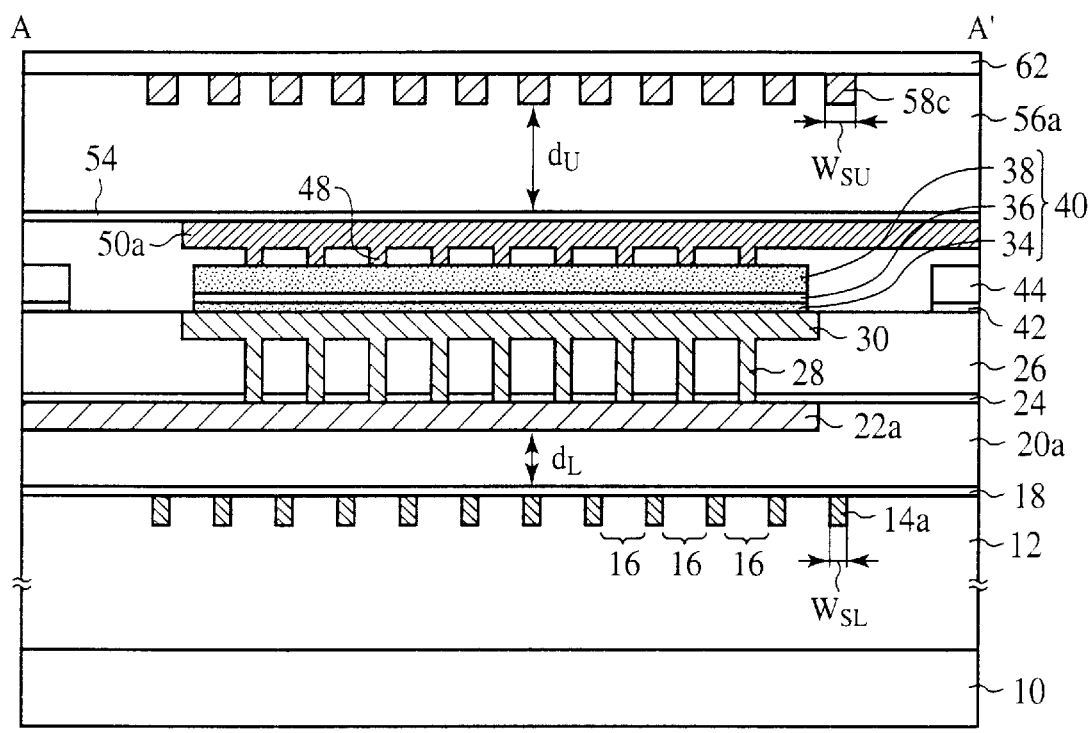
FIG. 26 is a sectional view of the semiconductor device according to a modification of the third embodiment of the present invention.
Figure 27A:
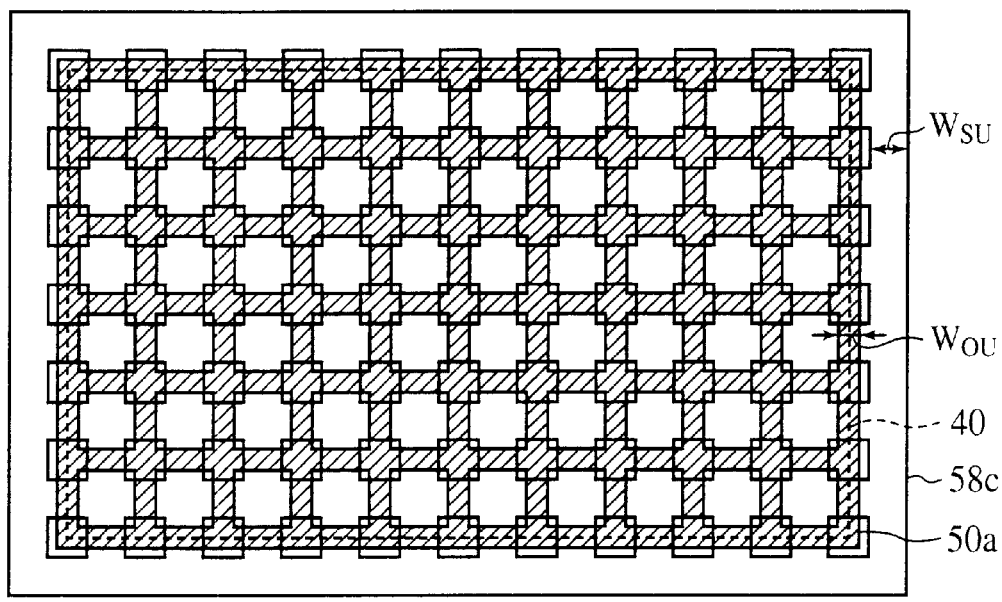
FIGS. 27A and 27B are plan views of the semiconductor device according to the modification of the third embodiment of the present invention.
Figure 27B:
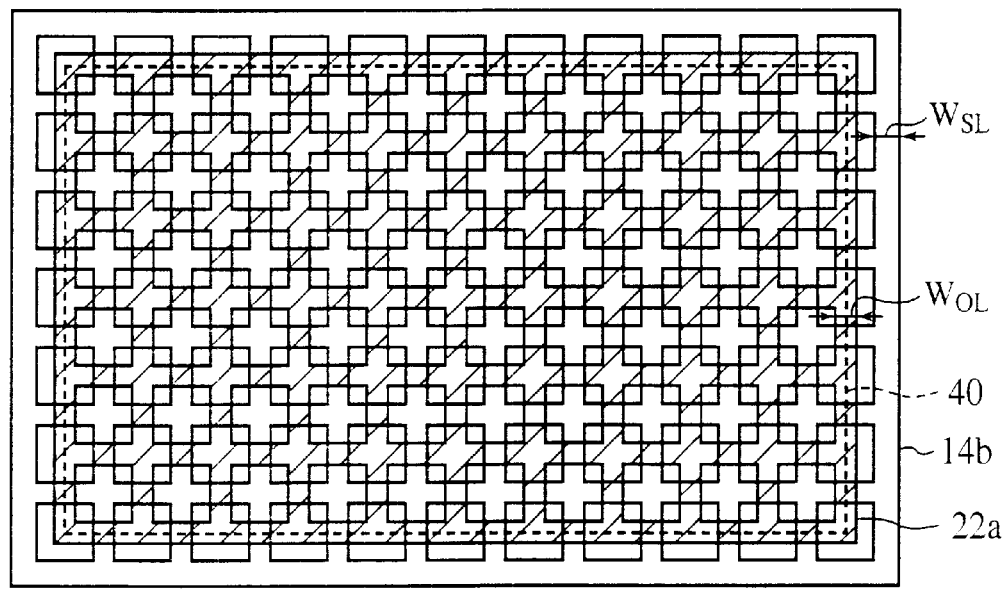

Next, the semiconductor device according to a modification of the present embodiment and the method for fabricating the semiconductor device will be explained with reference to FIGS. 26 to 27B. FIG. 26 is a sectional view of the semiconductor device according to the present modification. FIGS. 27A and 27B are plan views of the semiconductor device according to the present modification. FIG. 27A is a plan view showing an upper shield layer, an upper electrode lead-out interconnection layer and MIM capacitors. FIG. 27B is a plan view showing a lower shield layer, a lower electrode lead-out interconnection layer and the MIM capacitors.

The semiconductor device according to the present modification is characterized mainly in that not only a width $w_{SL}$ of a mesh-pattern of the lower shield layer 14b is set to be narrow, but also a width $w_{OL}$ of a mesh-pattern of the lower electrode lead-out interconnection layer 22a is set to be narrow, and not only a width $w_{SU}$ of the mesh-pattern of the upper shield layer 58c is set to be wide, but also a width $w_{OU}$ of the mesh-pattern of the upper electrode lead-out interconnection layer 50a is set to be wide.

As shown in FIGS. 26 and 27, a width $w_{SL}$ of the mesh-pattern of the lower shield layer 14a is set to be, e.g., 0.3 μm.

A width $w_{OL}$ of the mesh-pattern of the lower electrode lead-out interconnection layer 22a is set also to be, e.g., 0.3 μm, as is a width $w_{SL}$ of the mesh-pattern of the lower shield layer 14a.

A thickness $d_L$ of an inter-layer insulation film 20a is, e.g., 400 nm.

A thickness $d_U$ of an inter-layer insulation film 56a is, e.g., 800 nm.

The inter-layer insulation film 20a and the inter-layer insulation film 56a are formed of the same material. A dielectric constant of the inter-layer insulation film 20a and a dielectric constant of the inter-layer insulation film 56a are equal to each other.

A width $w_{OU}$ of the mesh-pattern of the upper electrode lead-out interconnection layer 50a is set to be, e.g., 0.42 μm.

A width $w_{SU}$ of the mesh-pattern of the upper shield layer 58c is set to be, e.g., 0.42 μm, as is a width $w_{OU}$ of the mesh-pattern of the upper electrode lead-out interconnection layer 50a.

Widths $w_{SL}$, $w_{OL}$, $w_{OU}$, $w_{OS}$ of the lower shield layer 14a, the lower electrode lead-out interconnection layer 22a, the upper electrode lead-out interconnection layer 50a and the upper shield layer 58c can be set respectively by the above-described method.

When a width $w_{SL}$ of the pattern of the lower shield layer 14a and a width $w_{OL}$ of the pattern of the lower electrode lead-out interconnection layer 22a are, e.g., 0.3 μm, and a width $w_{OU}$ of the pattern of the upper electrode lead-out interconnection layer 50a and a width $w_{SU}$ of the pattern of the upper shield layer 58c are, e.g., 0.42 μm, the above-described design rules are satisfied, without any remarkable problem.

As described above, not only a width $w_{SL}$ of the mesh-pattern of the lower shield layer 14b but also a width $w_{OL}$ of the mesh-pattern of the lower electrode lead-out interconnection layer 22a is set to be small, and not only a width $w_{SU}$ of the mesh-pattern of the upper shield layer 58c but also a width $w_{OU}$ of the mesh-pattern of the upper electrode lead-out interconnection layer 50a is set to be large, but a parasitic capacity $C_L$ between the lower shield layer 14b and the lower shield layer 22a and a parasitic capacity $C_U$ between the upper electrode lead-out interconnection layer 50a and the upper shield layer 58 are set to be substantially equal to each other. According to the present embodiment, a parasitic capacity $C_L$ between the lower shield layer 14a and the lower electrode lead-out interconnection layer 22a and a parasitic capacity $C_U$ between the upper electrode lead-out interconnection layer 50a and the upper shield layer 58c are made substantially equal to each other, whereby electric characteristic symmetry can be improved.

Fourth Embodiment

Figure 28A:
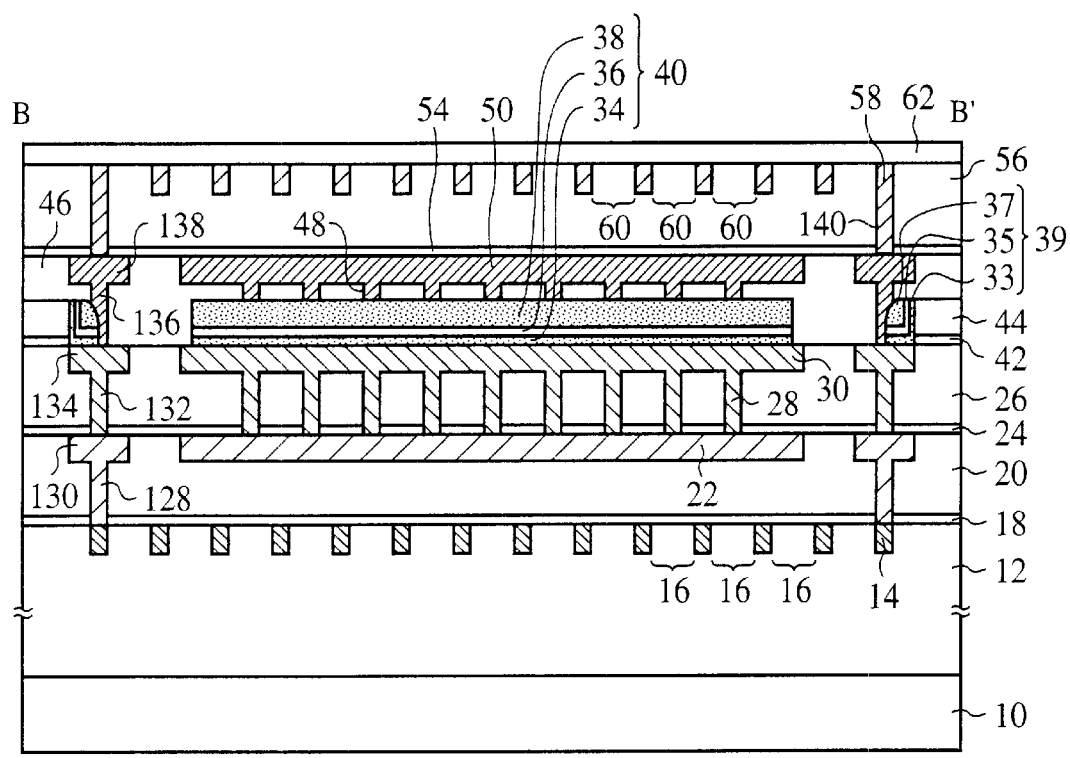
FIGS. 28A and 28B are a sectional view and a plan view of the semiconductor device according to a fourth embodiment of the present invention.
Figure 28B:
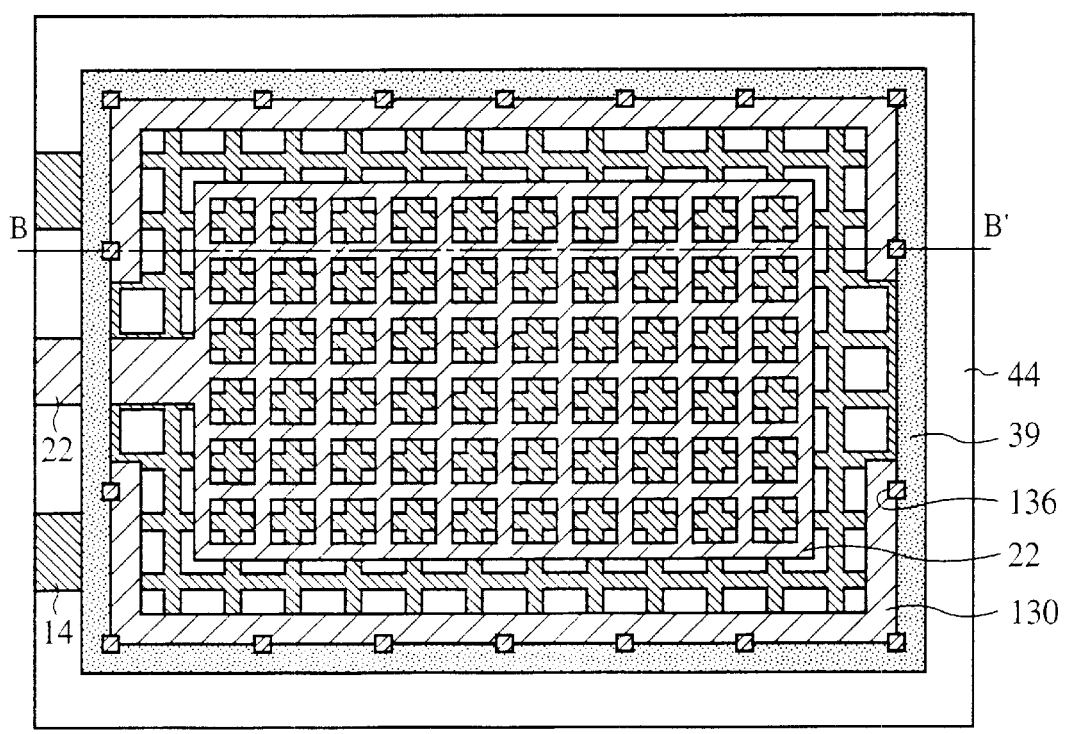

The semiconductor device according to a fourth embodiment of the present invention will be explained with reference to FIGS. 28A and 28B. FIGS. 28A and 28B are a sectional view and a plan view of the semiconductor device according to the present embodiment. FIG. 28B is a plan view of the semiconductor device according to the present embodiment. FIG. 28A is the sectional view along the line B–B' in FIG. 28B. The same members of the present embodiment as those of the semiconductor device according to the first to the third embodiments of the present invention and the method for fabricating the semiconductor device, which are shown in FIGS. 1 to 27B, are represented by the same reference numbers not to repeat or to simplify their explanation.

The semiconductor device according to the present embodiment is characterized mainly in that a layer film 39 remaining on the side wall of an insulation film 44 is electrically connected to a lower shield layer 14 and an upper shield layer 58.

Vias 128 and a conducting layer 130 are buried in an inter-layer insulation film 20 and a cap layer 18, electrically connected to the lower shield layer 14. The vias 128 and the conducting layer 130 are formed of one and the same $C_U$ layer forming a lower electrode lead-out interconnection layer 22.

Vias 132 and a conducting layer 134 are buried in an inter-layer insulation film 26 and a cap layer 24, electrically connected to the conducting layer 130. The vias 132 and the conducting layer 134 are formed of one and the same $C_U$ layer.

The layer film 39 remains on the side wall of the insulation film 44. The layer film 39 remaining on the side wall of the insulation film 44 is ring-shaped as shown in FIG. 28B.

A TiN film 33 forming the layer film 39 is electrically connected to the conducting layer 134.

Vias 136 and a conducting layer 138 are buried in an inter-layer insulation film 46, electrically connected to the conducting layer 134. The vias 136 and the conducting layer 138 are formed of one and the same Cu layer. The vias 136 are electrically connected to the TiN film 37 forming the layer film 39.

The upper shield layer 58 buried in the inter-layer insulation film 56 is electrically connected to the conducting layer 138 through vias 140 buried in an inter-layer insulation film 56 and a cap layer 54.

The lower shield layer 14 and the upper shield layer 58 are to be connected to a fixed potential (not shown), such as the ground or others.

As described above, the semiconductor device according to the present embodiment is characterized mainly in that the layer film 39 remaining on the side wall of the insulation film 44 is electrically connected to the lower shield layer 14 and the upper shield layer 58.

The layer film 39, which remains on the side wall of the insulation film 44, can be a parasitic capacity with respect to an MIM capacitor 40. Accordingly, when the layer film 39 remaining on the side wall of the insulation film 44 is floating without being connected to a fixed potential, an electrostatic capacity of the MIM capacitor 40 is often varied.

However, in the present embodiment, the layer film 39 remaining on the side wall of the insulation film 44 is connected to a fixed potential through the vias 128, 132, 136, 140, the conducting layers 130, 134, 138 and the lower shield layer 14, the upper shield layer 58, etc., whereby the dielectric capacity variation of the MIM capacitor 40 can be prevented.

Fifth Embodiment

Figure 29:
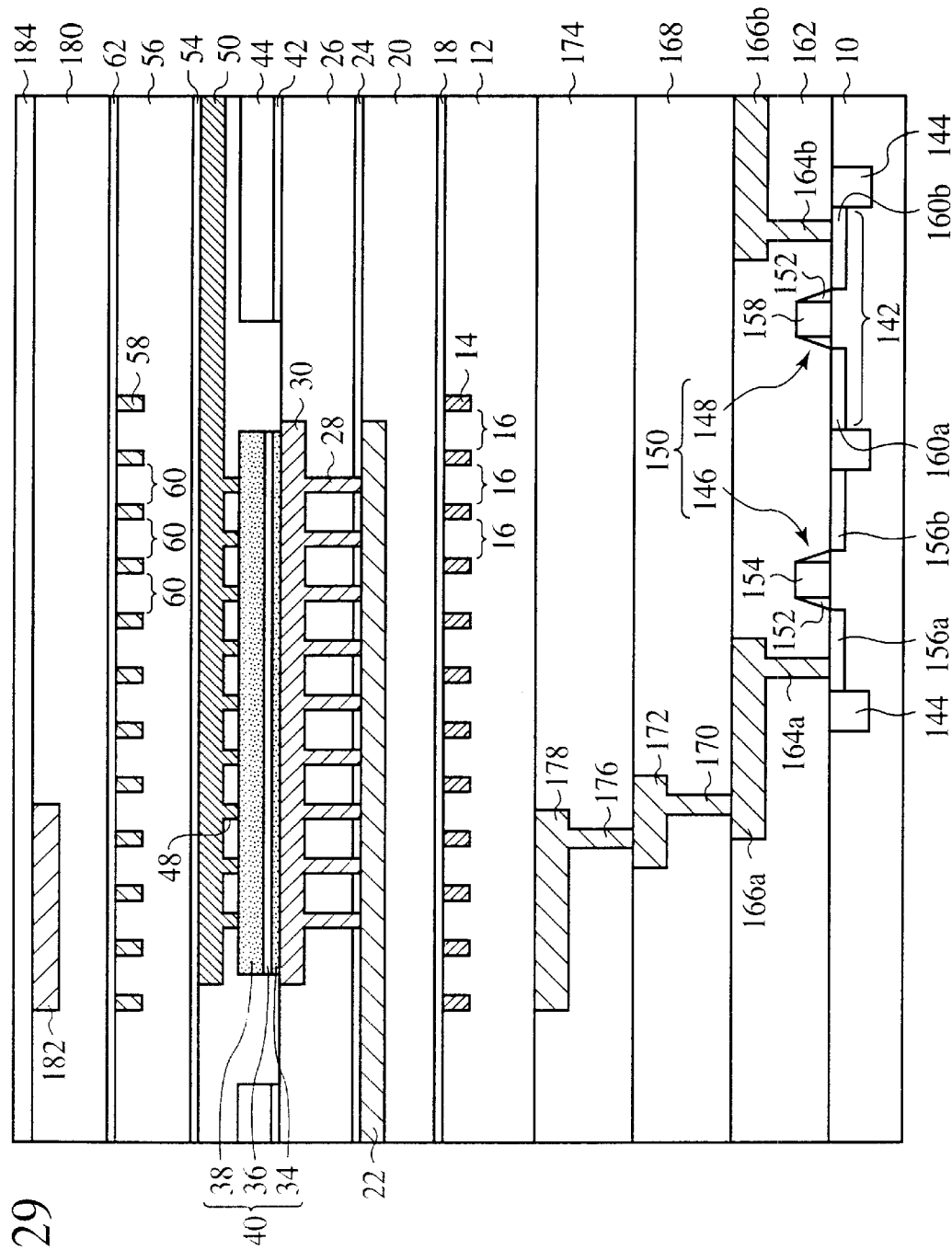
FIG. 29 is a sectional view of the semiconductor device according to a fifth embodiment of the present invention.

The semiconductor device according to a fifth embodiment of the present invention will be explained with reference to FIG. 29. FIG. 29 is a sectional view of the semiconductor device according to the present embodiment. The same members of the present embodiment as those of the semiconductor device according to the first to the fourth embodiments and the method for fabricating the semiconductor device, which are shown in FIGS. 1 to 28B, are represented by the same reference numbers not to repeat or to simplify their explanation.

The semiconductor device according to the present embodiment is characterized mainly in that interconnection layers and semiconductor elements are formed on a semiconductor substrate 10 below an MIM capacitor.

As shown in FIG. 29, an element insulation region 144 for defining an element region 142 is formed on the semiconductor substrate 10 of silicon.

A CMOS circuit 150 comprising a p-channel MOS transistor 146 and an n-channel MOS transistor 148 is formed in the element region 142 defined by the element isolation region 144.

The p-channel MOS transistor 146 comprises a p type gate electrode 154 with a sidewall insulation film 152 formed on the side wall, and p type source/drain regions 156a, 156b formed on both sides of the gate electrode 154.

The n-channel MOS transistor 148 comprises an n type gate electrode 158 with the sidewall insulation film 152 formed on the side wall, n type source/drain regions 160a, 160b formed on both sides of the gate electrode 158.

An inter-layer insulation film 162 of $SiO_2$ is formed on the semiconductor substrate 10 with the p-channel MOS transistor 146 and the n-channel MOS transistor 148 formed on.

Vias 164a, 164b and interconnection layers 166a, 166b are buried in the inter-layer insulation film 162. The vias 164a, 164b and the interconnection layers 166a, 166b are formed of one and the same Cu layer.

The via 164a and the interconnection layer 166a are electrically connected to the source/drain region 156a of the p-channel MOS transistor 146.

The via 164b and the interconnection layer 166b are electrically connected to the source/drain region 160b of the n-channel MOS transistor 148.

An inter-layer insulation film 158 of $SiO_2$ is formed on the inter-layer insulation film 162 with the vias 164a, 164b and the interconnection layers 160a, 160b buried in.

A via 170 and an interconnection layer 172 are buried in the inter-layer insulation film 168. The via 170 and the interconnection layer 172 are formed of one and the same Cu layer. The via 170 and the interconnection layer 172 are electrically connected to the interconnection layer 166a.

An inter-layer insulation film 174 of $SiO_2$ with the via 170 and the interconnection layer 172 buried in.

A via 176 and an interconnection layer 178 are buried in the inter-layer insulation film 174. The via 176 and the interconnection layer 178 are formed of one and the same Cu layer. The via 176 and the interconnection layer 178 are electrically connected to the interconnection layer 172.

An inter-layer insulation film 12 is formed on the inter-layer insulation film 174 with the via 176 and the interconnection layer 178 buried in.

An inter-layer insulation film 180 of $SiO_2$ is formed on a cap layer 62.

An interconnection layer 182 of Cu is buried in the inter-layer insulation film 180.

A cap layer 184 is formed on the inter-layer insulation film 180 with the interconnection layer 182 buried in.

As described above, the semiconductor device according to the present embodiment is characterized mainly in that the interconnection layers, the semiconductor elements, etc. are formed below the MIM capacitor 40, and the interconnection layers, etc. are formed above the MIM capacitor.

In a case that interconnection layers, semiconductor elements, etc. are simply formed above or below an MIM capacitor, noises are combined with the MIM capacitor. It has been conventionally impossible to form interconnection layers, semiconductor elements, etc. above or below an MIM capacitor. Accordingly, in forming an MIM capacitor it has been conventionally necessary to ensure a space for the MIM capacitor in a region different from a region where interconnection layers, semiconductor elements, etc. are formed.

However, according to the present embodiment, the lower shield layer 14 is formed below the MIM capacitor 40, whereby the MIM capacitor 40 can be shielded by the lower shield layer 14, which permits the semiconductor elements, such as transistors, etc., the interconnection layers, etc. to be disposed below the MIM capacitor 40.

According to the present embodiment, the upper shield layer 58 is formed above the MIM capacitor, whereby the MIM capacitor 40 can be shielded by the upper shield layer 58, which permits the interconnection layers 182, etc. to be disposed above the MIM capacitor 40.

As described above, according to the present embodiment, the interconnection layers, the semiconductor elements, etc. can be disposed above and below the MIM capacitor, whereby a space can be saved, and a chip area can be accordingly smaller. Thus, according to the present embodiment, the semiconductor device including the MIM capacitor can be inexpensively provided.

Sixth Embodiment

Figure 30:
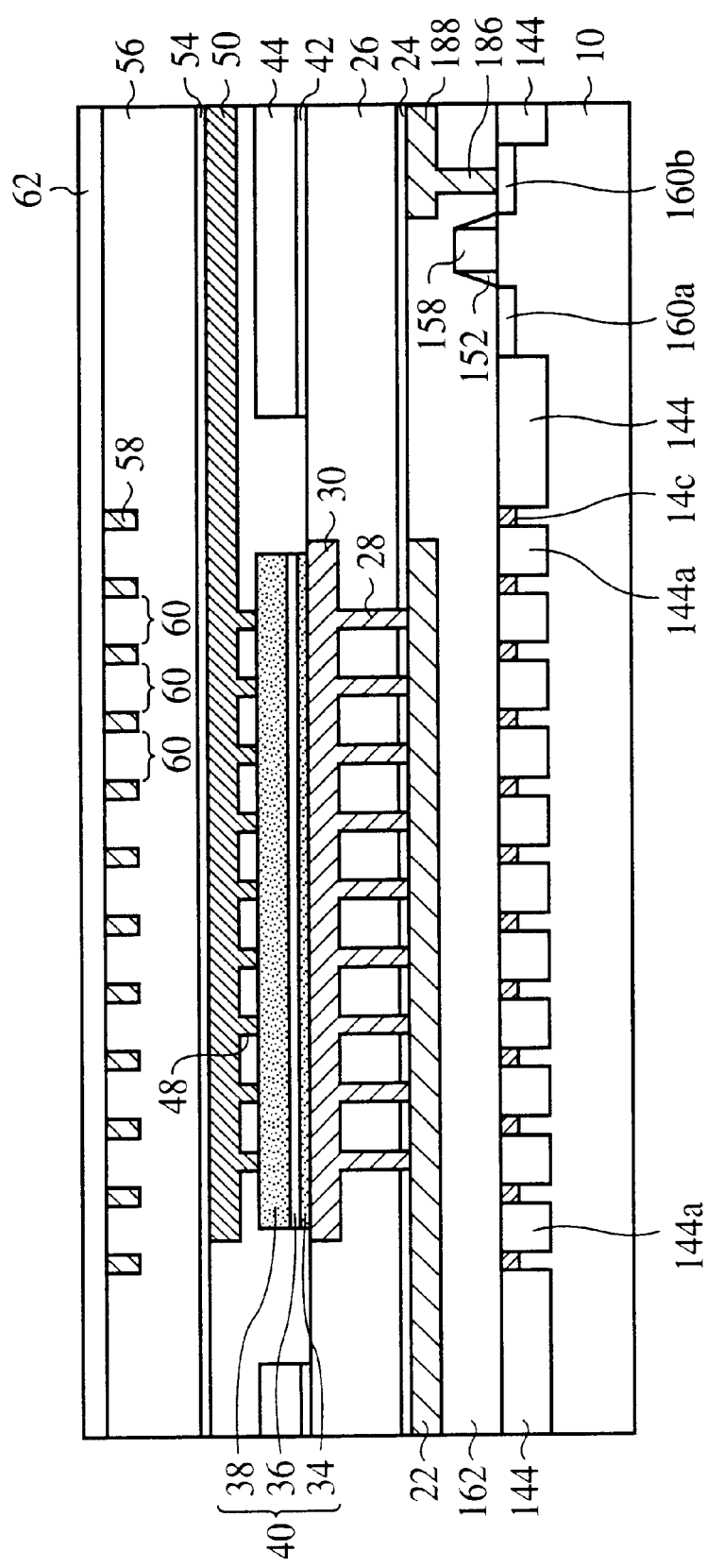
FIG. 30 is a sectional view of the semiconductor device according to a sixth embodiment of the present invention.

The semiconductor device according to a sixth embodiment of the present invention will be explained with reference to FIG. 30. FIG. 30 is a sectional view of the semiconductor device according to the present embodiment. The same members for the present embodiment as those of the semiconductor device according to the first to the fifth embodiments and the method for fabricating the same, which are shown in FIGS. 1 to 29, are represented by the same reference numbers not to repeat or to simplify their explanation.

The semiconductor device according to the present embodiment is characterized mainly in that a meshed lower shield layer 14c is buried in a semiconductor substrate 10.

As shown in FIG. 30, an insulation layer 144a of SiO$_2$ in the shape of a plurality of square poles is buried in a semiconductor substrate 10. The insulation film 144a is formed by, e.g., STI (Shallow Trench Isolation). The insulation layer 144a can be formed simultaneously with formation of an element isolation region 144 by one and the same step.

A meshed lower shield layer 14c is buried in the semiconductor substrate 10. The lower shield layer 14c is formed by implanting an impurity in the semiconductor substrate 10 by self-alignment with the insulation film 144a. The lower shield layer 14c can be formed simultaneously with formation of a source/drain region 160a, 160b by one and the same step.

An inter-layer insulation film 162 is formed on the semiconductor substrate 10 with the lower shield layer 14c formed on.

A lower electrode lead-out interconnection layer 22 is buried in the inter-layer insulation film 162. A via 186 and an interconnection layer 188 are buried in the inter-layer insulation film 162. The interconnection layer 188 and the via 186 are electrically connected to the source/drain regions 160b.

The semiconductor device according to the present embodiment has such structure.

The lower shield layer 14c may be thus buried in the semiconductor substrate 10.

Modified Embodiments

The present invention is not limited to the above-described embodiments and can cover other various modifications.

For example, in the above-described embodiments, the shield layers are disposed both above and below the MIM capacitor. However, the shield layers may not be disposed essentially both above and below the MIM capacitor. A shield layers may be disposed either above or below as required.

In the above-described embodiments, the lower electrode lining interconnection layer is formed. However, the lower electrode lining interconnection layer is not essential. For example, the MIM capacitor may be formed on the lower electrode lead-out interconnection layer without forming the lower electrode lining interconnection layer.

In the above-described embodiments, the vias are formed of Cu. However, the vias may be formed of materials other than Cu. Any material, e.g., W (tungsten), may be used.

In the above-described embodiments, a material of the interconnection layers is Cu but is not limited to Cu. Any material, e.g., Al or others can be used.

In the above-described embodiments, a pitch of the mesh-pattern of the shield layer is equal to a pitch of the mesh-pattern of the lead-out interconnection layer. However, a pitch of the mesh-pattern of the shield layer is not essentially equal to a pitch of the mesh-pattern of the lead-out interconnection layer. For example, pitches of the mesh-pattern of the shield layer and of the mesh-pattern of the lead-out interconnection layer are set so as to be substantially an integer.

In the above-described embodiments, the shield layer, the lead-out interconnection layers, etc. are formed in meshes but may be formed in, e.g., stripe-patterns other than the mesh-patterns. However, the mesh-pattern is superior to the stripe-pattern in that the shielding effect of the former has no direction dependency. The meshed shield layers have higher freedom in the automatic design by CAD than the striped shield layers.

In the above-described embodiments, the shield layers, the lead-out interconnection layer, etc. are meshed. However, a plurality of holes, for example, may be formed in the shield layers and the lead-out interconnection layers. Even with the shield layers and the lead-out interconnection layers having a plurality of holes formed in, the same shield effect as that of the above-described embodiments can be produced while the above-described design rules being satisfied.

In the above-described embodiments, the mesh-pattern of the lower shield layer 14 and the mesh-pattern of the lower electrode lead-out interconnection layer 22 are offset from each other by a half pitch in their relative positional relationship, and the mesh-pattern of the upper electrode lead-out interconnection layer 50 and the mesh-pattern of the upper shield layer 58 are offset from each other by a half pitch in their relative positional relationship. However, the mesh-patterns may not be offset by a half pitch. The mesh-patterns are offset relative to each other by a suitable pitch, whereby a parasitic capacity can be reduced.

The third embodiment has been explained by means of an example in which a gap $d_U$ between the upper electrode lead-out interconnection layer and the upper shield layer is different from a gap $d_L$ between the lower electrode lead-out interconnection layer and the lower shield layer. However, the third embodiment is applicable to an example where a dielectric constant of the inter-layer insulation film 56a between the upper electrode lead-out interconnection layer and the upper shield layer is different from a dielectric constant of the inter-layer insulation film 20a between the lower electrode lead-out interconnection layer and the lower shield layer.

In the fourth embodiment, the layer film 39 remaining on the side wall of the insulation film 44 is electrically connected to the lower shield layer 14 and the upper shield layer 58. However, the layer film 39 is not essentially connected electrically to the lower shield layer 14 and the upper shield layer 58 and can be connected to any fixed potential. For example, the layer film 39 remaining on the side wall of the insulation film 44 may be connected to a fixed potential, such as a power source conductor, the grounding conductor or others.

What is claimed is:

1. A semiconductor device comprising:
   a semiconductor substrate;
   a capacitor element formed above the semiconductor substrate and including a lower electrode, a capacitor insulation film formed on the lower electrode and an upper electrode formed on the capacitor insulation film;
   a shield layer formed at least either of above and below the capacitor element; and
   a lead-out interconnection layer formed between the capacitor element and the shield layer and electrically connected to the lower electrode or the upper electrode,
   a plurality of holes being formed in each of the shield layer and the lead-out interconnection layer.

2. The semiconductor device according to claim 1, wherein
   the shield layer and the lead-out interconnection layer are mesh-patterned.

3. The semiconductor device according to claim 1, wherein the shield layer and the lead-out interconnection layer are stripe-patterned.

4. The semiconductor device according to claim 2, wherein a ratio of a pitch of the pattern of the shield layer to a pitch of the pattern of the lead-out interconnection layer is substantially an integer.

5. The semiconductor device according to claim 3, wherein a ratio of a pitch of the pattern of the shield layer to a pitch of the pattern of the lead-out interconnection layer is substantially an integer.

6. The semiconductor device according to claim 2, wherein the pattern of the shield layer and the pattern of the lead-out interconnection layer are offset from each other.

7. The semiconductor device according to claim 3, wherein the pattern of the shield layer and the pattern of the lead-out interconnection layer are offset from each other.

8. The semiconductor device according to claim 1, wherein the shield layer is formed over a larger area larger than an area where the capacitor element is formed.

9. The semiconductor device according to claim 1, further comprising:

a semiconductor element formed on the semiconductor substrate below the capacitor element with the shield layer therebetween.

10. The semiconductor device according to claim 1, further comprising:

an interconnection layer formed above or below the capacitor element with the shield layer therebetween.

11. The semiconductor device according to claim 1, wherein the shield layer is buried in the semiconductor substrate.

12. The semiconductor device according to claim 1, wherein an insulation film having a height substantially equal to a height of the upper surface of the capacitor element is formed around the capacitor element.

13. The semiconductor device according to claim 12, wherein a conducting film remaining on the side wall of the insulation film is to be connected to a fixed potential.

14. The semiconductor device according to claim 12, wherein the conducting film is electrically connected to the shield layer.

15. The semiconductor device according to claim 1, wherein a thickness of the upper electrode is larger than a thickness of the lower electrode.

16. The semiconductor device according to claim 1, wherein an etching stopper film is formed on the upper electrode.

17. The semiconductor device, according to claim 1, wherein a pattern of the capacitor element is formed with an arrangement of respective plural numbers of a first basic pattern forming an inner part of the capacitor element, a second basic pattern forming a part containing a peripheral edge of the capacitor element and a third basic pattern forming a part containing a corner of the capacitor element.

18. The semiconductor device according to claim 17, wherein a pattern of the lead-out interconnection layer is an arrangement of a plurality of the basic patterns formed respectively corresponding to the fist to the third basic patterns.

19. The semiconductor device according to claim 17, wherein a pattern of the shield layer is an arrangement of a plurality of basic patterns formed respectively corresponding to the first to the third basic patterns.

20. The semiconductor device according to claim 1, wherein the shield layer and the lead-out interconnection layer are formed respectively above and below the capacitor element.

* * * * *